(12) United States Patent
Mantani

(10) Patent No.: US 9,724,911 B2
(45) Date of Patent: Aug. 8, 2017

(54) METHOD OF SCREEN PRINTING

(71) Applicant: PANASONIC INTELLECTUAL PROPERTY MANAGEMENT CO., LTD., Osaka (JP)

(72) Inventor: Masayuki Mantani, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/333,663

(22) Filed: Oct. 25, 2016

(65) Prior Publication Data

US 2017/0036435 A1   Feb. 9, 2017

Related U.S. Application Data

(62) Division of application No. 14/867,079, filed on Sep. 28, 2015.

(30) Foreign Application Priority Data

Dec. 1, 2014   (JP) ................. 2014-242811

(51) Int. Cl.
*B41F 15/08*    (2006.01)
*H05K 3/34*    (2006.01)
*B41F 15/44*    (2006.01)
*B41F 15/18*    (2006.01)
*B41F 15/36*    (2006.01)
(Continued)

(52) U.S. Cl.
CPC .......... *B41F 15/44* (2013.01); *B41F 15/0881* (2013.01); *B41F 15/18* (2013.01); *B41F 15/36* (2013.01); *B41F 15/46* (2013.01); *H05K 3/1225* (2013.01); *B41P 2215/114* (2013.01); *H05K 3/3484* (2013.01); *H05K 2201/094* (2013.01); *H05K 2201/09736* (2013.01)

(58) Field of Classification Search
CPC .. B41F 15/08; B41F 15/0863; B41F 15/0881; B41F 15/26; B41F 15/36; B41F 15/40; B41F 15/42; B41F 15/44; B41F 15/46; B41F 15/18; H05K 3/36; H05K 3/1216; H05K 3/1225; H05K 3/1233; H05K 2201/09736; H05K 2203/0165; H05K 2203/1476; H05K 3/3484; H05K 2201/094; B41P 2215/114
USPC ........................................................ 101/123
See application file for complete search history.

(56) References Cited

U.S. PATENT DOCUMENTS 5,813,331 A    9/1998  Tan
5,873,939 A *  2/1999  Doyle .................. H05K 3/1216
                                                 101/123

(Continued)

FOREIGN PATENT DOCUMENTS

GB    2480579    * 11/2011    .............. B41F 15/26
JP    2014-120745 A    6/2014

*Primary Examiner* — Jill Culler
*Assistant Examiner* — Marissa Ferguson Samreth
(74) *Attorney, Agent, or Firm* — Pearne & Gordon LLP

(57) ABSTRACT

A screen printing apparatus includes a mask and a printing head. The mask has a first opening provided in a first region, and a second opening provided in a second region which is thicker than the first region. The printing head fills the first opening with a paste in a state where a substrate is in contact with the first region, and fills the second opening with the paste in a state where the substrate is in contact with the second region.

2 Claims, 24 Drawing Sheets

(51) Int. Cl.
*B41F 15/46* (2006.01)
*H05K 3/12* (2006.01)

(56) References Cited

U.S. PATENT DOCUMENTS

| | | | |
|---|---|---|---|
| 6,267,819 B1 * | 7/2001 | Doyle | H05K 3/1216 101/126 |
| 6,352,026 B1 | 3/2002 | Murakami | |
| 2011/0315028 A1 * | 12/2011 | Abe | B41F 15/26 101/114 |
| 2014/0170304 A1 | 6/2014 | Fujimoto | |
| 2015/0075721 A1 * | 3/2015 | Mantani | H05K 3/368 156/387 |
| 2015/0163925 A1 | 6/2015 | Nakatsuji | |

* cited by examiner

METHOD OF SCREEN PRINTING

CROSS-REFERENCE TO RELATED APPLICATION(S)

This application is a divisional of U.S. patent application Ser. No. 14/867,079 filed on Sep. 28, 2015 which claims priority from Japanese Patent Application No. 2014-242811 filed on Dec. 1, 2014, the entire contents of which are incorporated herein by reference.

BACKGROUND

1. Field of the Invention

One or more embodiments of the present invention relate to a screen printing apparatus which prints a paste on a substrate by using a mask in which an opening is formed, and to a component mounting line which is provided with the screen printing apparatus.

2. Description of Related Art

A screen printing apparatus prints a paste on a substrate by filling an opening with the paste by a printing head after bringing a mask, in which an opening is formed, into contact with the substrate. The thickness of the paste printed on the substrate can be set according to the thickness of the mask, and the thickness of the paste on one substrate is generally a single thickness (one type). Regarding the substrate on which a small-sized component, such as a chip component, and a large-sized component, such as a connector, coexist, since a larger amount of paste is necessary when bonding the large-sized component than that of when bonding the small-sized component, there is also a case where two types of pastes which have different thicknesses are necessary to be printed on the substrate. In this case, in the related art, two masks which have different thicknesses from each other and in which openings are respectively formed are installed in parallel in the screen printing apparatus, and after performing the printing by the mask which is thinner than the other, the printing is performed by a mask which is thicker than the other (for example, refer to JP-A-2014-120745).

SUMMARY

However, when two masks are disposed in one screen printing apparatus, there is a problem that the size of the entire apparatus increases.

Here, an object of one or more embodiments of the present invention is to provide a screen printing apparatus which can print two types of pastes which have different thicknesses from each other without increasing the size of the apparatus, and a component mounting line.

According to an aspect of the present invention, there is provided a screen printing apparatus, including: a mask which has a first opening provided in a first region, and a second opening provided in a second region which is thicker than the first region; and a printing head which fills the first opening with a paste in a state where a substrate is in contact with the first region, and fills the second opening with the paste in a state where the substrate is in contact with the second region.

According to another aspect of the present invention, there is provided a component mounting line, including: the screen printing apparatus; and a component mounting apparatus which mounts a component onto a substrate on which the paste is printed by the screen printing apparatus.

According to one or more embodiments of the present invention, it is possible to print two types of pastes which have different thicknesses from each other without increasing the size of the apparatus.

DETAILED DESCRIPTION

First Embodiment

Figure 1:
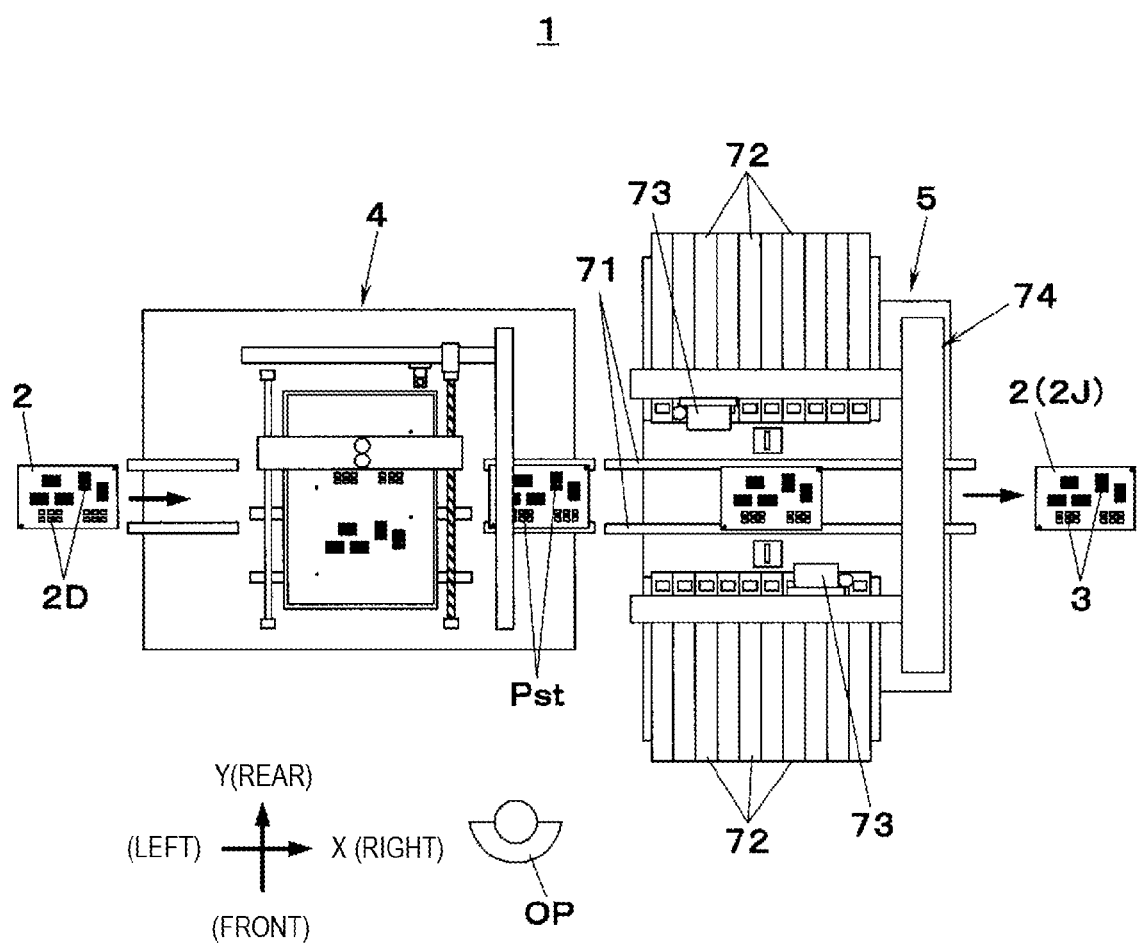
FIG. 1 is a plan view of a component mounting line according to a first embodiment of the present invention.

FIG. 1 illustrates a component mounting line 1 according to a first embodiment of the present invention. The component mounting line 1 mounts a component 3 onto a substrate 2 and manufactures a mounted substrate 2J, and is provided with a screen printing apparatus 4 and a component mounting apparatus 5 which is disposed on a downstream process side thereof. The screen printing apparatus 4 receives the substrate 2 which is input from an upstream process side, screen-prints a paste Pst on an electrode 2D of the substrate 2, and delivers the substrate 2 to the component mounting apparatus 5. The component mounting apparatus 5 receives the substrate 2 from the screen printing apparatus 4, and mounts the component 3 onto the electrode 2D on which the paste Pst is printed. In the following description, for convenience, a horizontal direction of the component mounting line 1 when viewed from an operator OP is considered as an X-axis direction, and the substrate 2 flows from a left side to a right side in the X-axis direction. In addition, a longitudinal direction of the component mounting line 1 when viewed from the operator OP is considered as a Y-axis direction, and a vertical direction is considered as a Z-axis direction.

Figure 2:
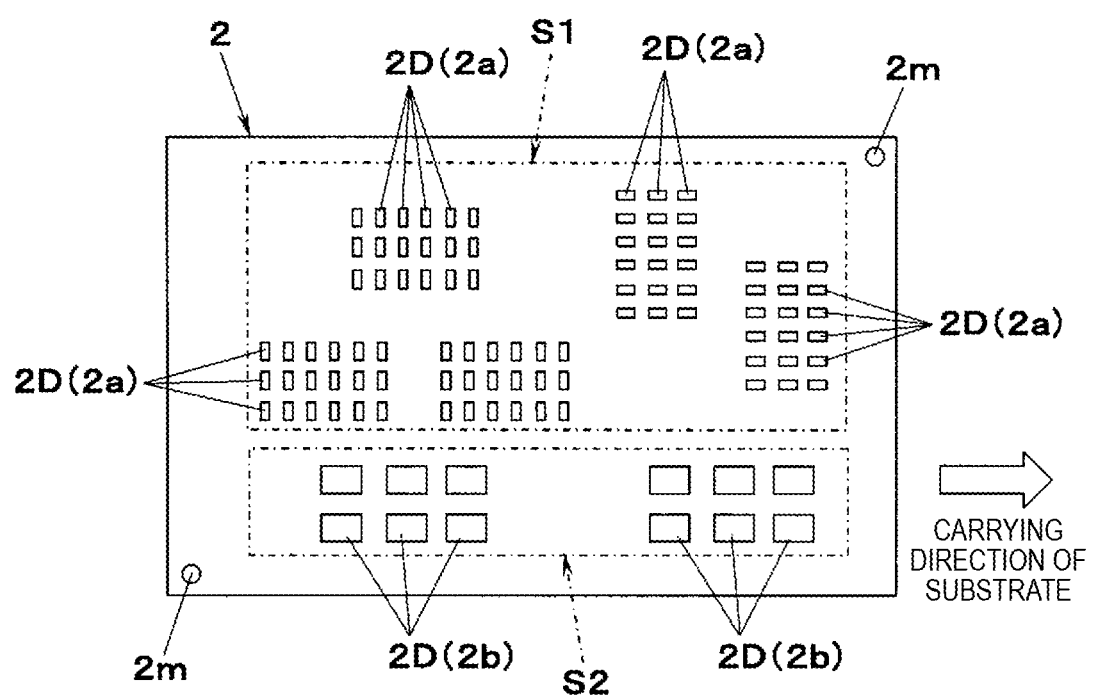
FIG. 2 is a plan view of a substrate on which the component mounting line performs component-mounting according to the first embodiment of the present invention.

As illustrated in FIG. 2, the electrode 2D of the substrate 2 includes two types of electrodes (a first type electrode 2a and a second type electrode 2b). The first type electrode 2a is an electrode on which a small-sized component 3, such as a chip component, is mounted, and the second type electrode 2b is an electrode on which a large-sized component 3, such as a connector, is mounted. For this reason, a larger amount of paste Pst is necessary on the second type electrode 2b than that which is necessary on the first type electrode 2a, and, on the second type electrode 2b, the screen printing apparatus 4 prints the paste Pst which is thicker than that which is printed on the first type electrode 2a. A region S1 illustrated in FIG. 2 indicates a region on the substrate 2 provided with the first type electrode 2a, and a region S2 indicates a region on the substrate 2 provided with the second type electrode 2b.

Figure 3:
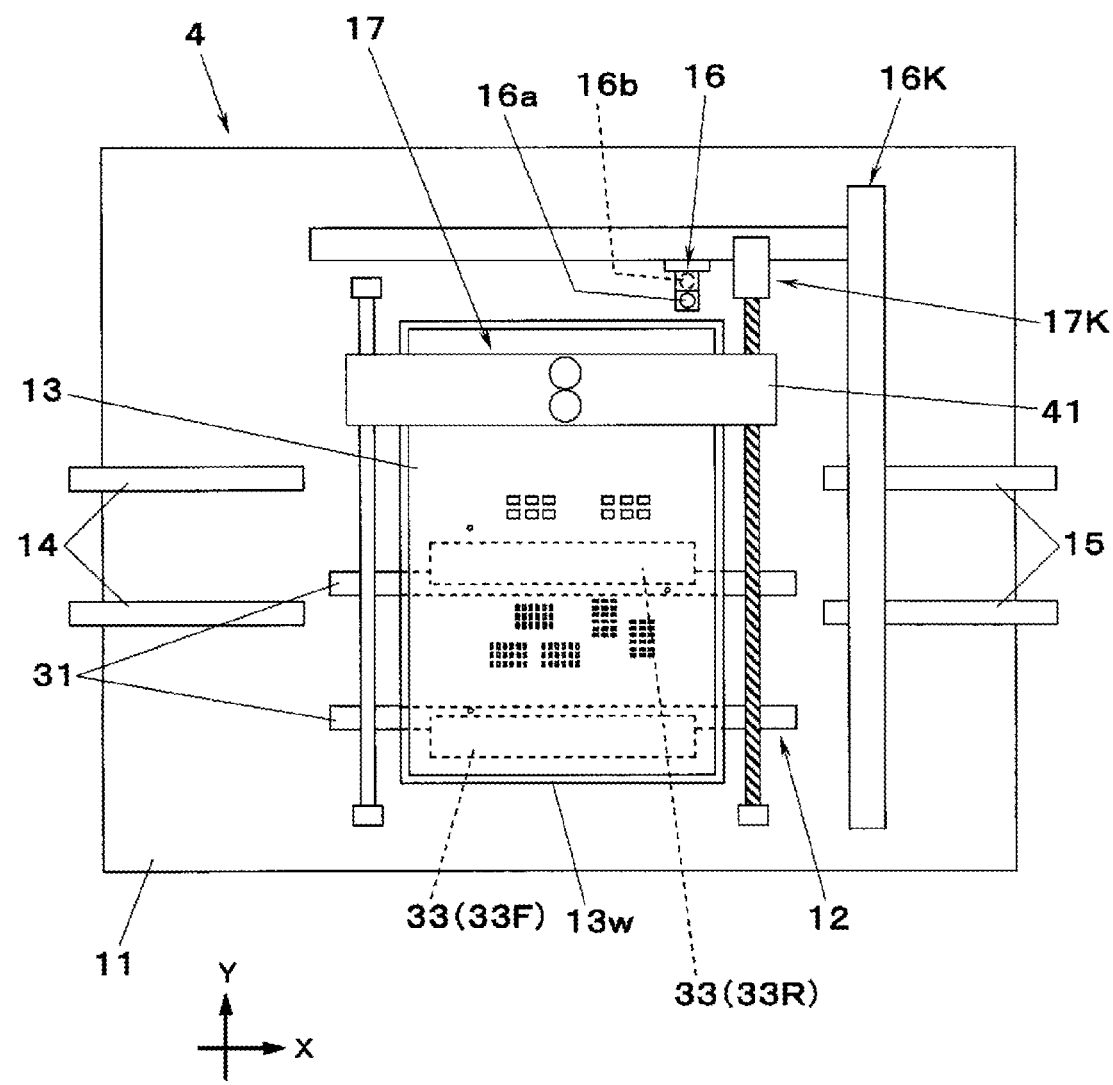
FIG. 3 is a plan view of a screen printing apparatus according to the first embodiment of the present invention.
Figure 4:
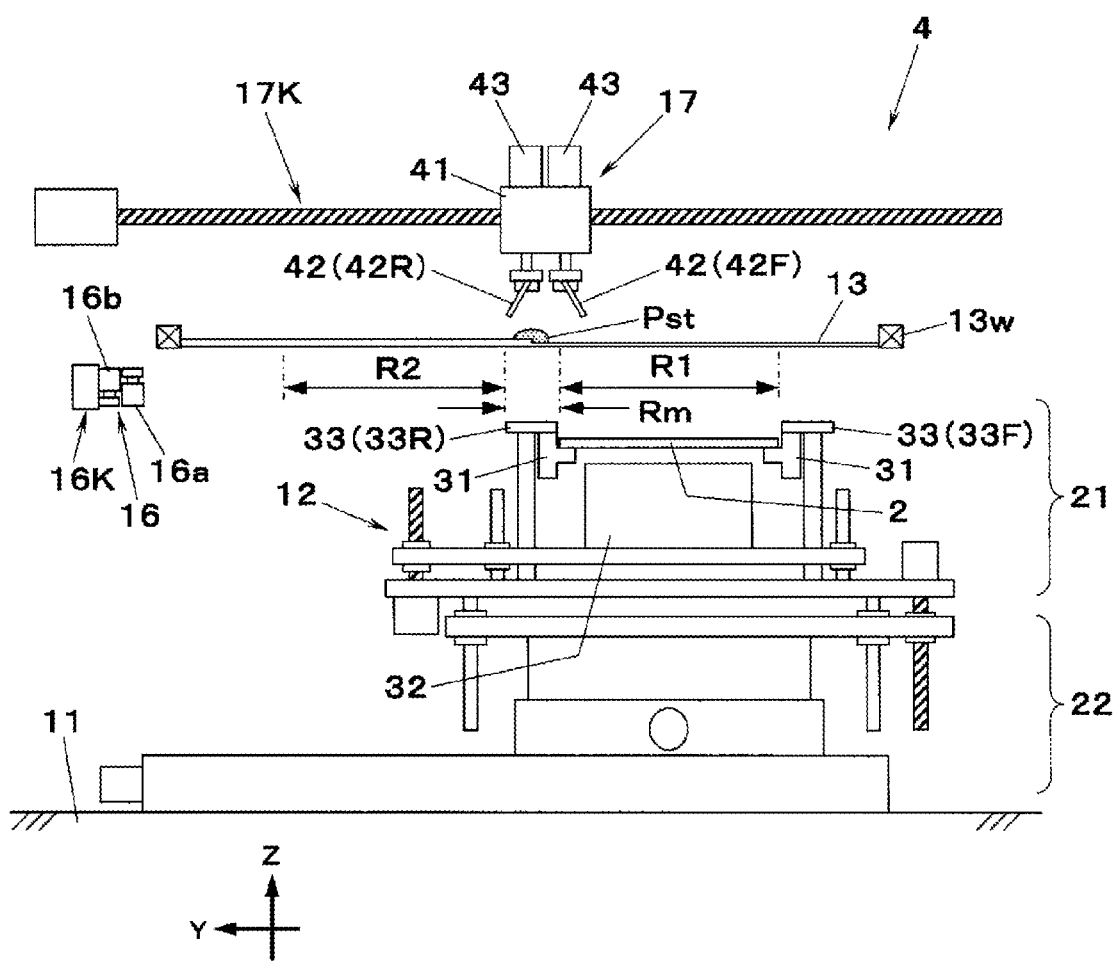
FIG. 4 is a side view of the screen printing apparatus according to the first embodiment of the present invention.

In FIGS. 3 and 4, the screen printing apparatus 4 is provided with a substrate holding and moving mechanism 12 on a base 11, and a mask 13 is provided above the substrate holding and moving mechanism 12. On an upstream process side of the substrate holding and moving mechanism 12 on the base 11, a carrying-in conveyor 14 which receives the substrate 2 input from the outside of the screen printing apparatus 4 and carries the substrate 2 to the substrate holding and moving mechanism 12 is provided. On a downstream process side of the substrate holding and moving mechanism 12 on the base 11, a carrying-out conveyor 15 which receives the substrate 2 from the substrate holding and moving mechanism 12 and carries the substrate 2 to an apparatus (here, the component mounting apparatus 5) on the downstream process side is provided. A camera 16 is provided below the mask 13, and a printing head 17 is provided above the mask 13.

In FIG. 4, the substrate holding and moving mechanism 12 includes a substrate holding portion 21 and a moving table portion 22. The substrate holding portion 21 is provided with a positioning conveyor 31 (refer to FIG. 3), a lower receiving portion 32, and one pair of clampers 33 (refer to FIG. 3). The positioning conveyor 31 positions the substrate 2 which is sent from the carrying-in conveyor 14, to a predetermined clamping position. The lower receiving portion 32 supports the substrate 2 which is positioned to the clamping position by the positioning conveyor 31 from below, and the pair of clampers 33 clamps the substrate 2 from the Y-axis direction. In this manner, the substrate 2 is held by the lower receiving portion 32 and the pair of clampers 33. Among the two clampers 33 provided in the substrate holding portion 21, a clamp which is positioned on the operator OP side is called a front clamper 33F, and a clamp which is positioned on a side opposite to the operator OP is called a rear clamper 33R. The moving table portion 22 includes a table mechanism which is stacked in multiple layers, and moves the substrate holding portion 21 which holds the substrate 2 in a direction within a horizontal surface and in the vertical direction.

Figure 5:
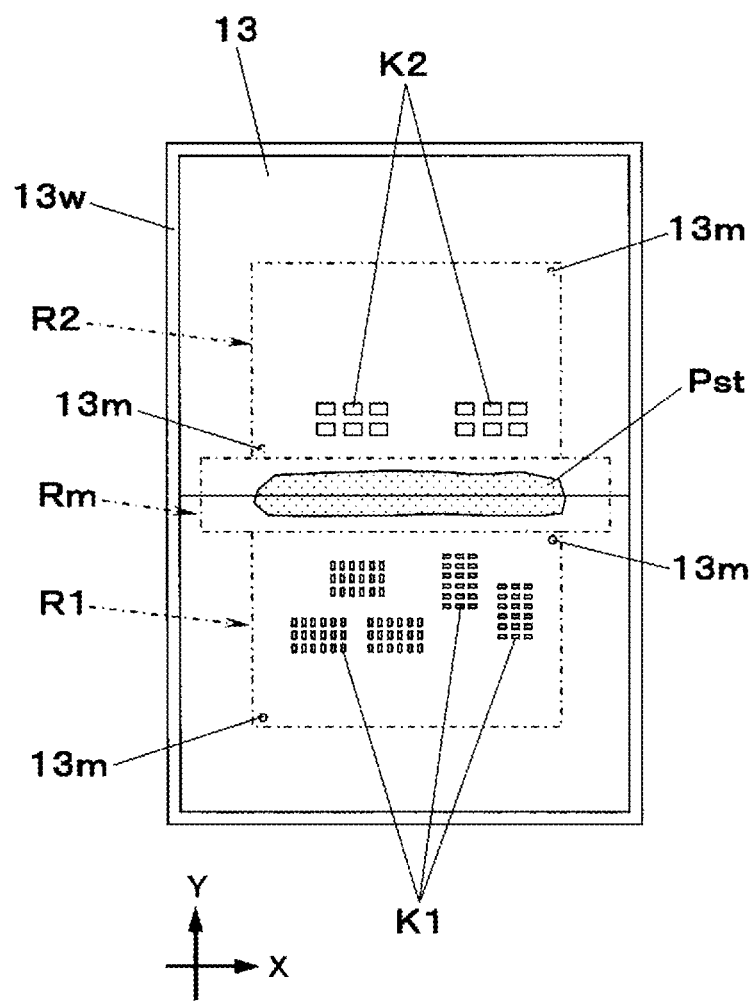
FIG. 5 is a plan view of a mask which is provided in the screen printing apparatus according to the first embodiment of the present invention.

In FIG. 5, the mask 13 has a shape of a rectangular plate which widens on an XY surface. An outer circumference of the mask 13 is supported by a frame member 13w. The thicknesses in a region on a front side and in a region on a rear side of the mask 13 are different from each other, and the thickness in the region on the rear side is thicker than the thickness in the region on the front side.

Figure 6:
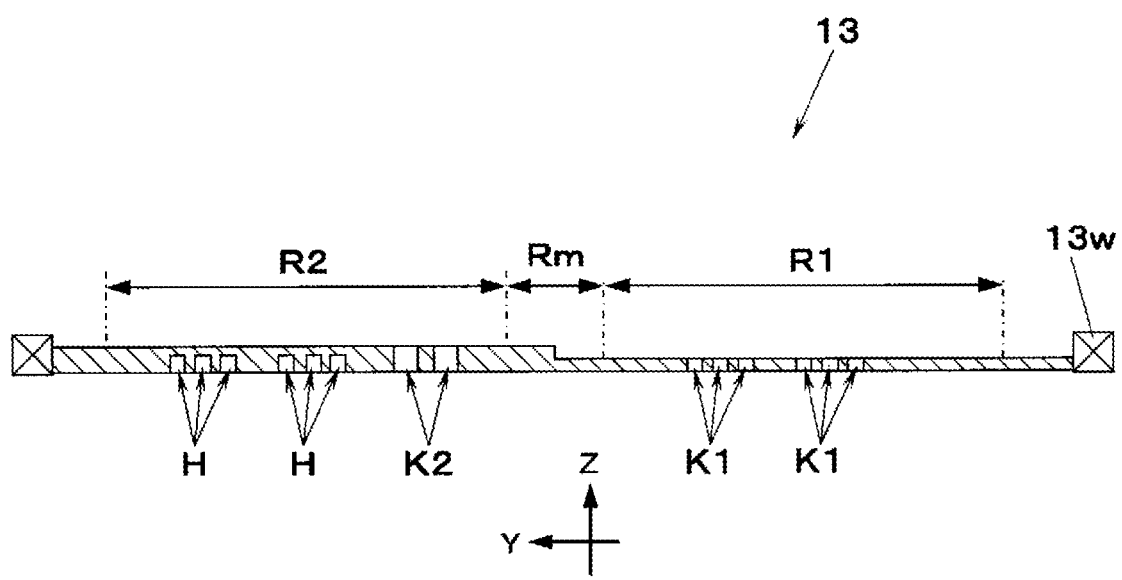
FIG. 6 is a side sectional view of the mask which is provided in the screen printing apparatus according to the first embodiment of the present invention.

As illustrated in FIGS. 4 and 5, a front masking region R1 (first region) which is a region that comes into contact with the substrate 2 is included in the region on the front side of the mask 13, and a rear masking region R2 (second region) which is a region that comes into contact with the substrate 2 is included in the region on the rear side of the mask 13. A region between the front masking region R1 and the rear masking region R2 includes an intermediate region Rm which has a difference (step) in thickness between the front masking region R1 and the rear masking region R2. In the first embodiment, a lower surface of the front masking region R1 and a lower surface of the rear masking region R2 are the same plane, and the height of the lower surface of the front masking region R1 and the height of the lower surface of the rear masking region R2 are equivalent to each other (FIG. 6).

A first type opening K1 (first opening) is provided in the front masking region R1. A second type opening K2 (second opening) is provided in the rear masking region R2. The first type opening K1 is provided in a first pattern which corresponds to the disposition of the first type electrode 2a, and the second type opening K2 is provided in a second pattern which corresponds to the disposition of the second type electrode 2b. In other words, the mask 13 has the first type opening K1 in the front masking region R1, and has the second type opening K2 in the rear masking region R2 which is thicker than the front masking region R1.

In FIGS. 3 and 4, the camera 16 is provided with an upper imaging portion 16a in which an imaging visual field faces upward, and a lower imaging portion 16b in which an image visual field faces downward. The camera 16 is driven by a camera moving mechanism 16K and moves on the XY surface. The upper imaging portion 16a of the camera 16 images mask-side marks 13m (FIG. 5) which are respectively provided in the front masking region R1 and the rear masking region R2 of the mask 13, from below. The lower imaging portion 16b of the camera 16 images substrate-side marks 2m (FIG. 3) of the substrate 2 held by the substrate holding portion 21, from above.

The substrate holding and moving mechanism 12 raises the substrate 2 and brings the substrate 2 into contact with a lower surface of the mask 13 after positioning the substrate 2 with respect to mask 13 referring to a relative position of the mask-side mark 13m and the substrate-side mark 2m which are imaged by the camera 16. When printing the paste Pst on the first type electrode 2a, the substrate 2 is brought into contact with the front masking region R1 (FIG. 7A), and when printing the paste Pst on the second type electrode 2b, the substrate 2 is brought into contact with the rear masking region R2 (FIG. 7B).

Figure 7A:
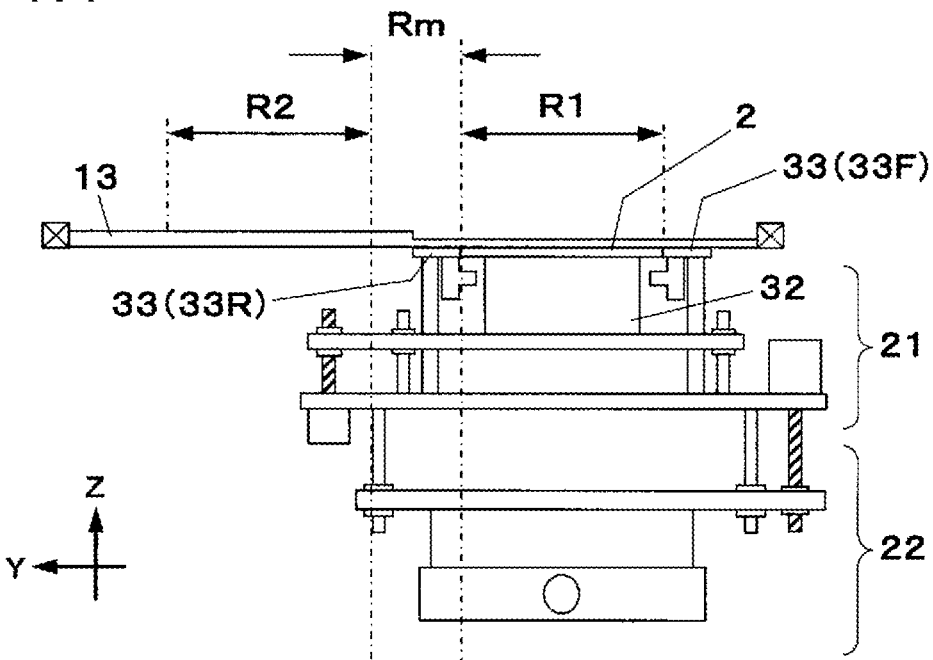
FIGS. 7A and 7B are partial side views of the screen printing apparatus according to the first embodiment of the present invention.
Figure 7B:
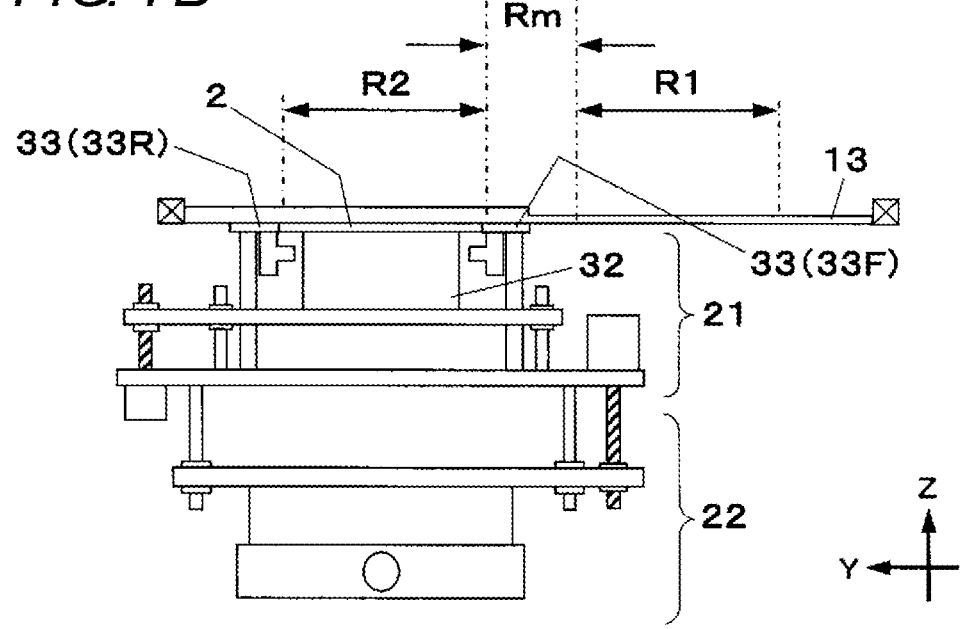

When the substrate 2 which is held in the substrate holding portion 21 is brought into contact with the front masking region R1, the front clamper 33F is positioned in front of the front masking region R1, and the rear clamper 33R is positioned in the intermediate region Rm which is behind the front masking region R1 (FIG. 7A). Meanwhile, when the substrate 2 which is held by the substrate holding portion 21 is brought into contact with the rear masking region R2, the rear clamper 33R is positioned behind the rear masking region R2, and the front clamper 33F is positioned in the intermediate region Rm which is in front of the rear masking region R2 (FIG. 7B). The paste Pst is supplied to the intermediate region Rm when the printing is started (FIG. 5).

Figure 8A:
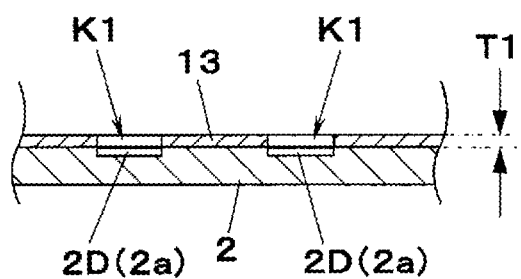
FIGS. 8A and 8B are side sectional views of the mask and a substrate which are provided in the screen printing apparatus according to the first embodiment of the present invention.
Figure 8B:
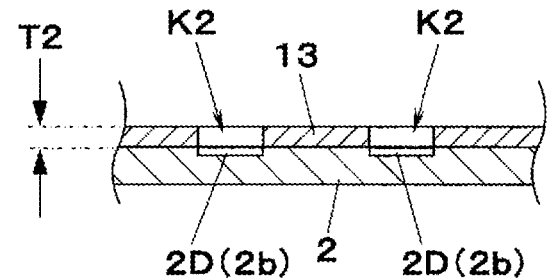

When the substrate 2 is brought into contact with the front masking region R1, the first type electrode 2a of the substrate 2 matches the first type opening K1 of the mask 13, and is exposed on the upper surface side of the mask 13 through the first type opening K1 (FIG. 8A). A thickness T1 of the mask 13 in the front masking region R1 is a thickness of the paste Pst when the paste Pst is printed on the first type electrode 2a as it is. Meanwhile, when the substrate 2 is brought into contact with the rear masking region R2, the second type electrode 2b matches the second type opening K2 of the mask 13, and is exposed on the upper surface side of the mask 13 through the second type opening K2 (FIG. 8B). A thickness T2 of the mask 13 in the rear masking region R2 is a thickness of the paste Pst when the paste Pst is printed on the second type electrode 2b as it is.

In FIGS. 3 and 4, the printing head 17 includes a moving base 41 which extends in the X-axis direction, two squeegees 42 which are disposed to face each other in the Y-axis direction below the moving base 41, and two squeegee raising and lowering cylinders 43 which raise and lower each squeegee 42 provided in the moving base 41 with respect to the moving base 41. The moving base 41 is driven by a printing head moving mechanism 17K and moves in the Y-axis direction, and accordingly, each squeegee 42 is moved in the Y-axis direction. Among the two squeegees 42 provided to be aligned in the Y-axis direction, a squeegee which is positioned on a front side (right side of a paper surface of FIG. 4) is called a front squeegee 42F, and a squeegee which is positioned on a rear side (left side of the paper surface of FIG. 4) is called a rear squeegee 42R.

Figure 9:
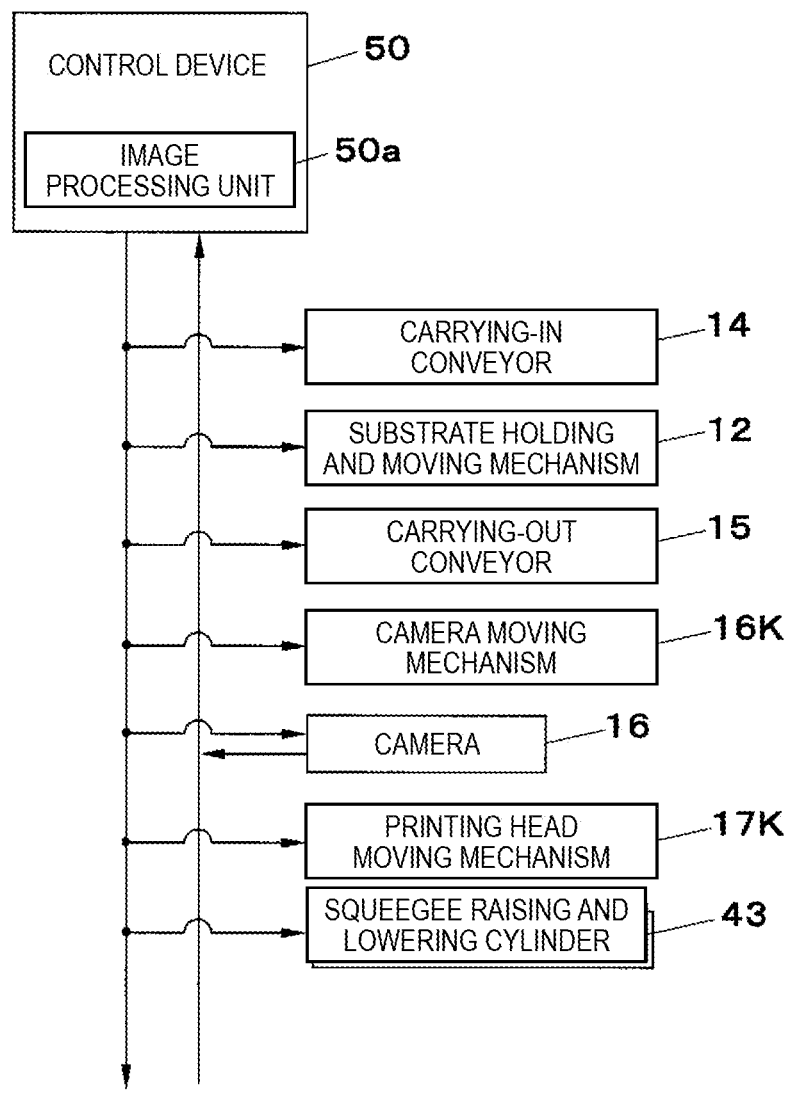
FIG. 9 is a block diagram illustrating a control system of the screen printing apparatus according to the first embodiment of the present invention.

The screen printin apparatus 4 includes a control device 50 (FIG. 9). The control device 50 may include, e.g., a memory configured to store instructions; and at least one processor configured to execute the instructions to cause the screen printing apparatus 4 to perform at least one of the operations thereof. A control of each of a carrying operation of the substrate 2 by the carrying-in conveyor 14, holding and moving operations of the substrate 2 by the substrate holding and moving mechanism 12, and a carrying operation of the substrate 2 by the carrying-out conveyor 15 is performed by the control device 50 which is provided in the screen printing apparatus 4. In addition, a control of each of a moving operation of the camera 16 by the camera moving mechanism 16K, a moving operation of the printing head 17 by the printing head moving mechanism 17K, a raising and lowering operation of each squeegee 42 by the squeegee raising and lowering cylinder 43, and an imaging operation of the camera 16 is also performed by the control device 50. Image data obtained by the imaging of the camera 16 is sent to the control device 50, and image recognition processing is performed in an image processing unit 50a (FIG. 9) of the control device 50.

Next, an operation of the screen printing apparatus 4 configured as described above will be described. The screen printing apparatus 4 prints (secondary printing) the paste Pst on the second type electrode 2b by using the second type opening K2 of the rear masking region R2 after printing (primary printing) the paste Pst on the first type electrode 2a by using the first type opening K1 of the front masking region R1.

Figure 10A:
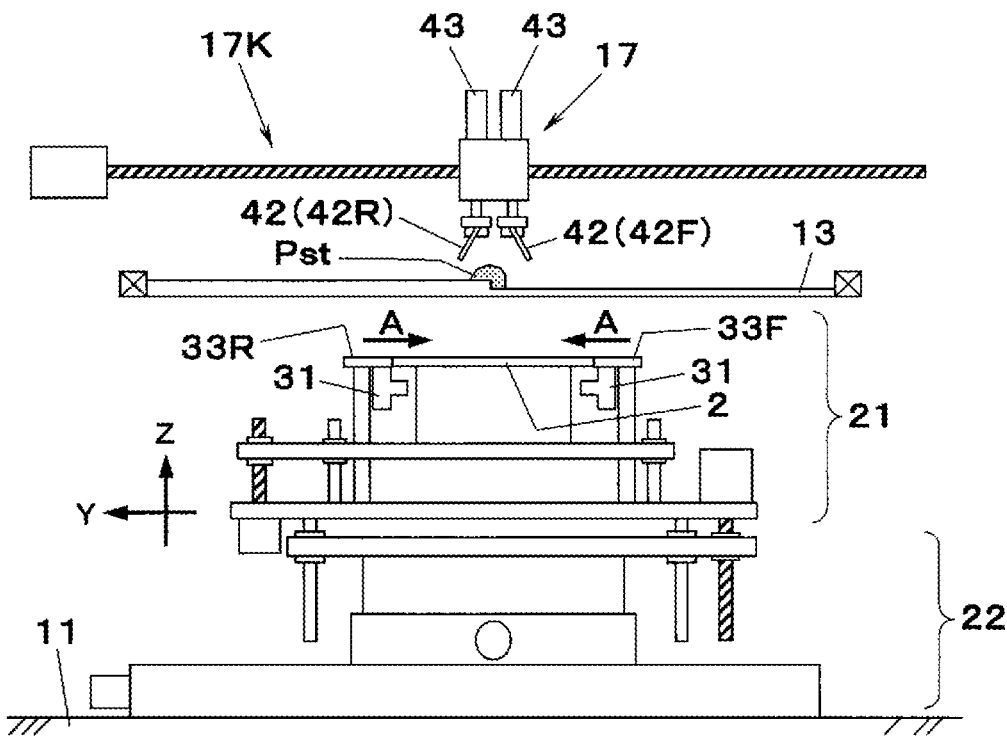
FIGS. 10A and 10B are views illustrating an operation of the screen printing apparatus according to the first embodiment of the present invention.
Figure 10B:
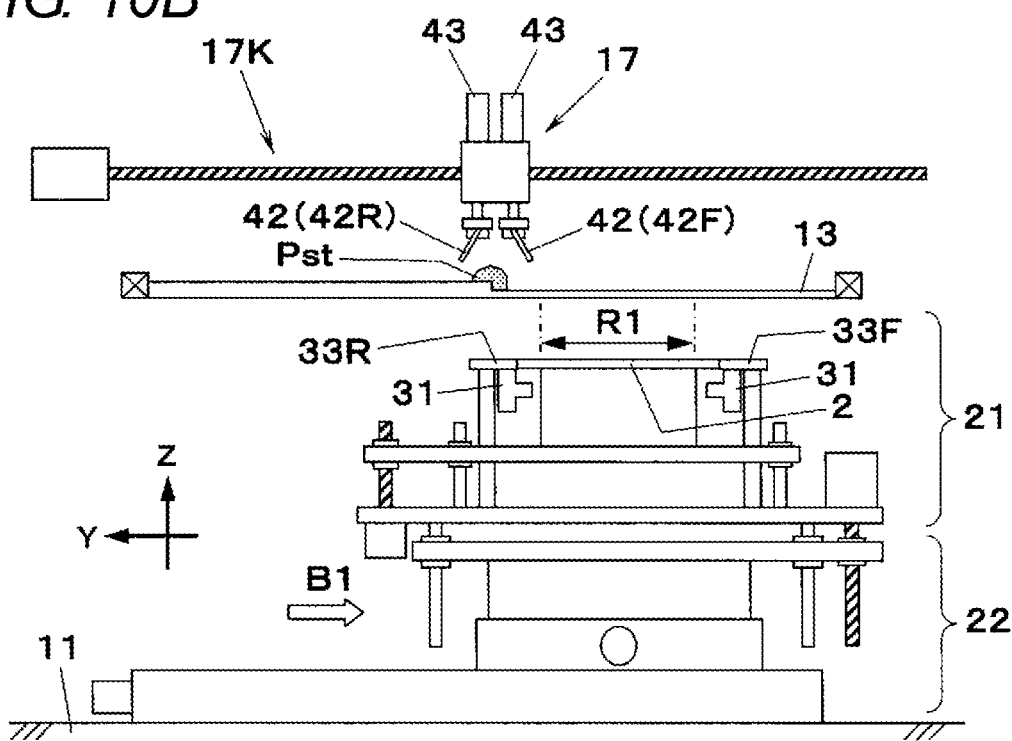

When the substrate 2 is input from the upstream process side, the carrying-in conveyor 14 receives the substrate 2, and delivers the substrate 2 to the substrate holding portion 21. The substrate holding portion 21 positions the substrate 2 received from the carrying-in conveyor 14 to the predetermined clamping position by the positioning conveyor 31, supports the substrate 2 by the lower receiving portion 32 from below, and then, clamps the substrate 2 by the pair of clampers 33 (illustrated with an arrow A in FIG. 10A). In this manner, when the substrate holding portion 21 holds the substrate 2, the substrate holding and moving mechanism 12 moves the substrate holding portion 21, and positions the substrate 2 below the front masking region R1 (illustrated with an arrow B1 in FIG. 10B).

Figure 11A:
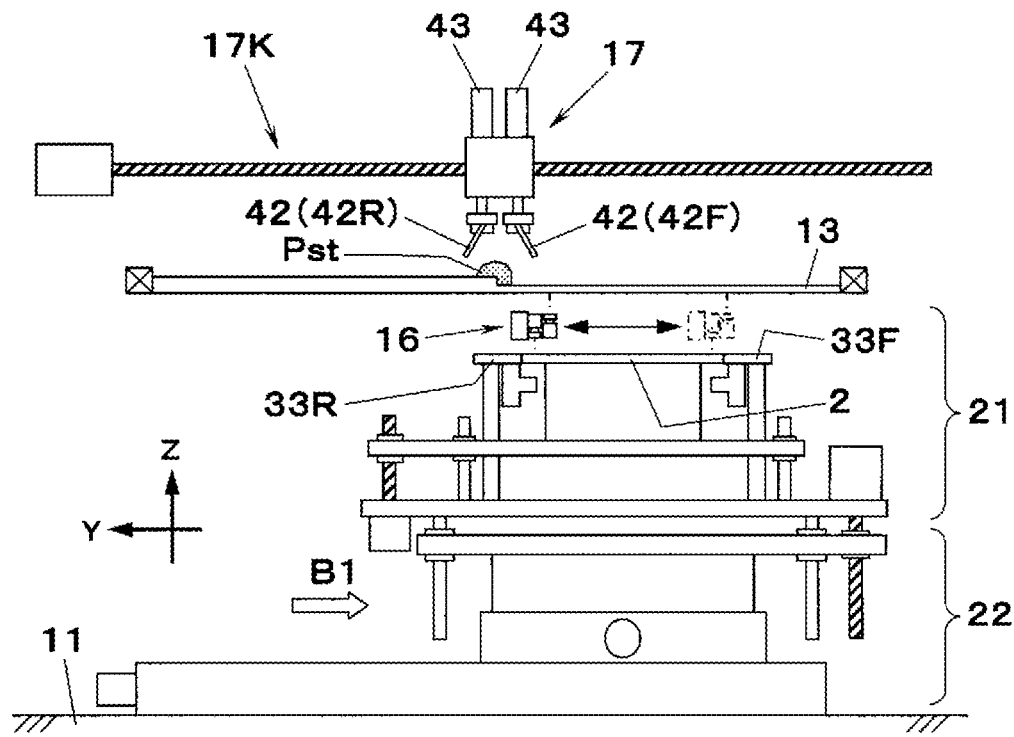
FIGS. 11A and 11B are views illustrating an operation of the screen printing apparatus according to the first embodiment of the present invention.
Figure 11B:
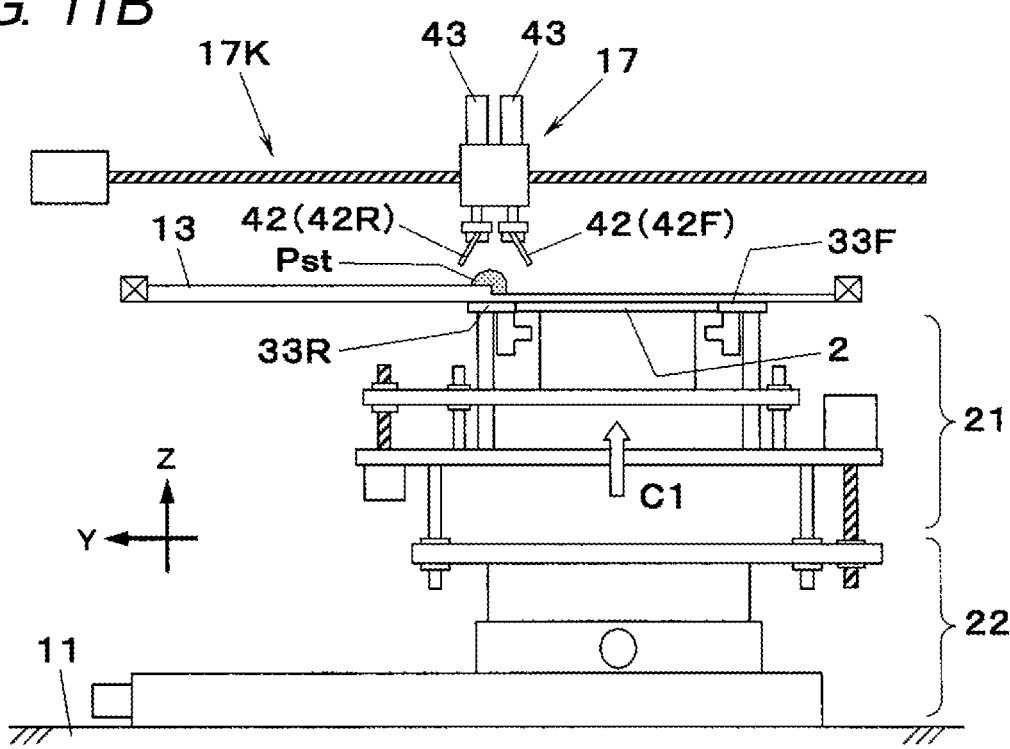
Figure 12A:
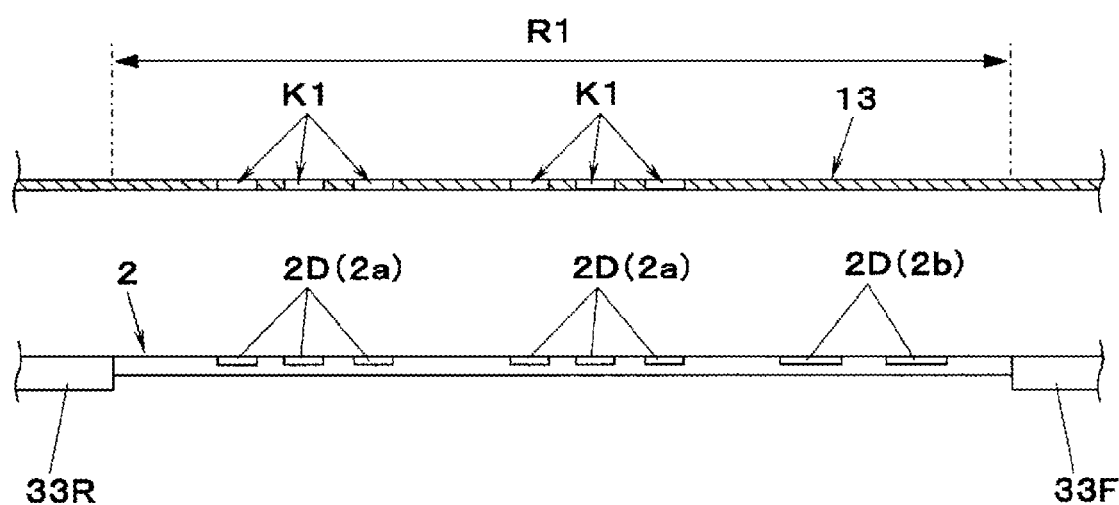
FIGS. 12A and 12B are views illustrating the mask and the substrate which are provided in the screen printing apparatus according to the first embodiment of the present invention.
Figure 12B:
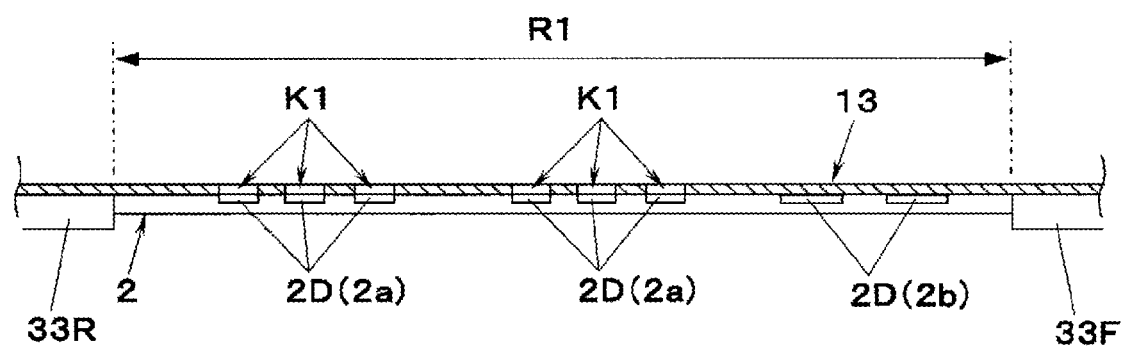

When the substrate 2 is positioned below the front masking region R1, the camera 16 moves, images the mask-side mark 13m in the front masking region R1 by the upper imaging portion 16a, and images the substrate-side mark 2m by the lower imaging portion 16b (FIG. 11A). When the imaging by the camera 16 is finished, the substrate holding and moving mechanism 12 moves and raises the substrate 2 so that the obtained mask-side mark 13m and the substrate-side mark 2m match each other when viewed in a plan view, and brings the substrate 2 into contact with the front masking region R1 (illustrated with an arrow C1 in FIG. 11B). Accordingly, each first type electrode 2a matches the inside of the corresponding first type opening K1, and is exposed on the upper surface side of the mask 13. Meanwhile, each second type electrode 2b is in a state of being covered with the mask 13 (FIG. 12A to FIG. 12B).

Figure 13A:
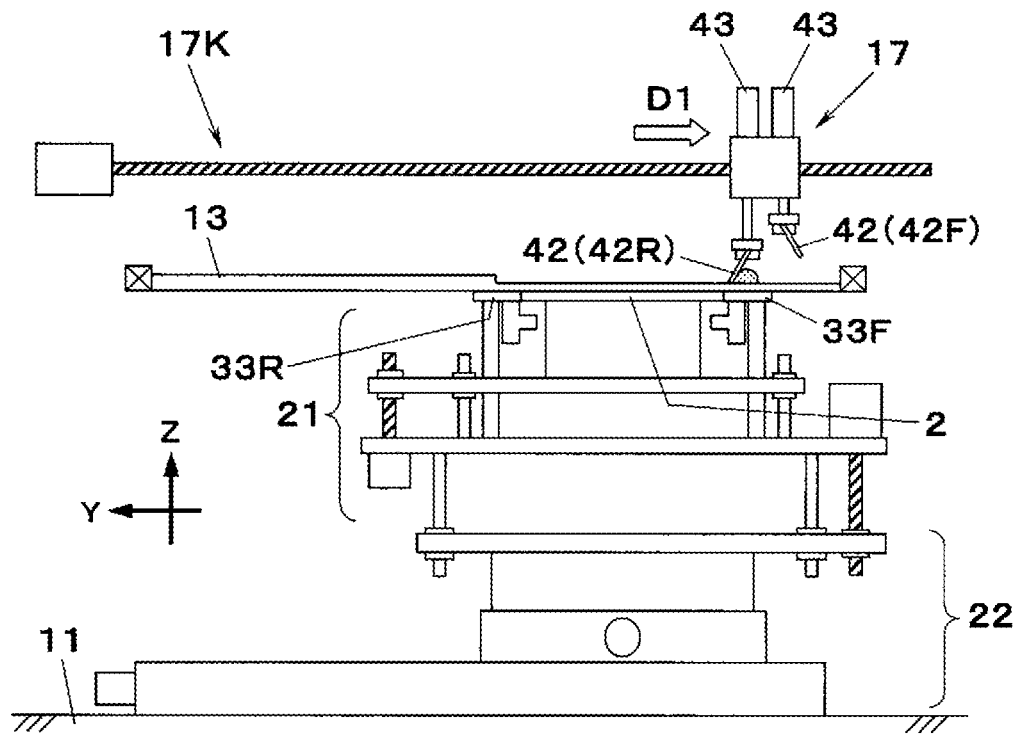
FIGS. 13A and 13B are views illustrating an operation of the screen printing apparatus according to the first embodiment of the present invention.
Figure 13B:
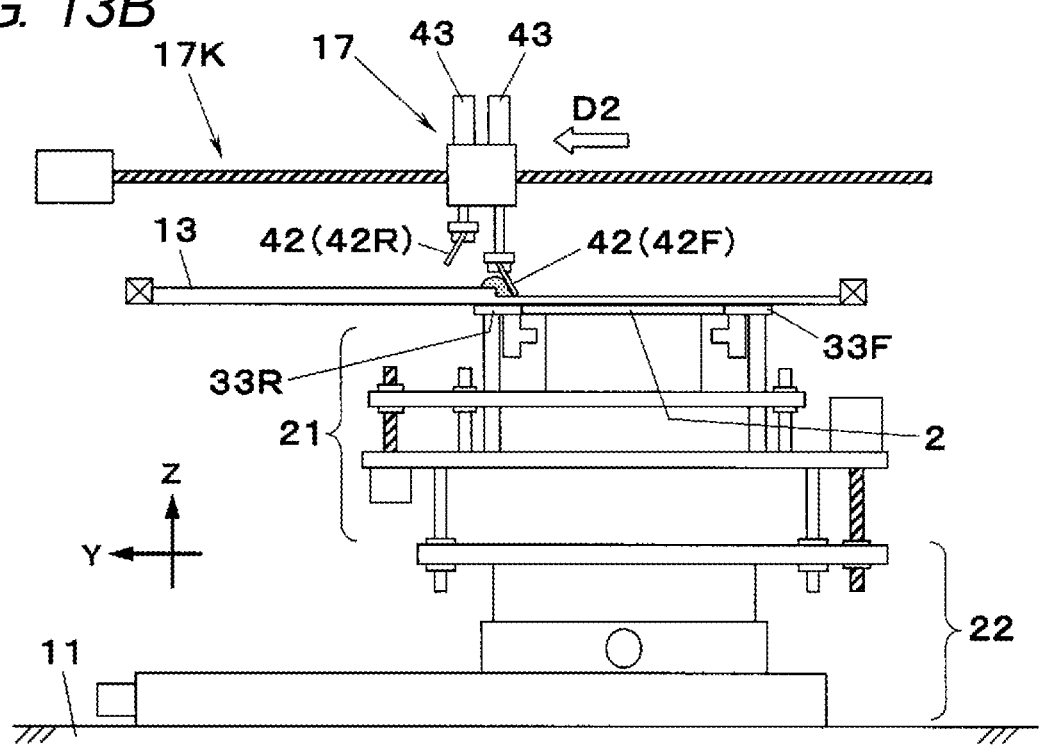
Figure 14A:
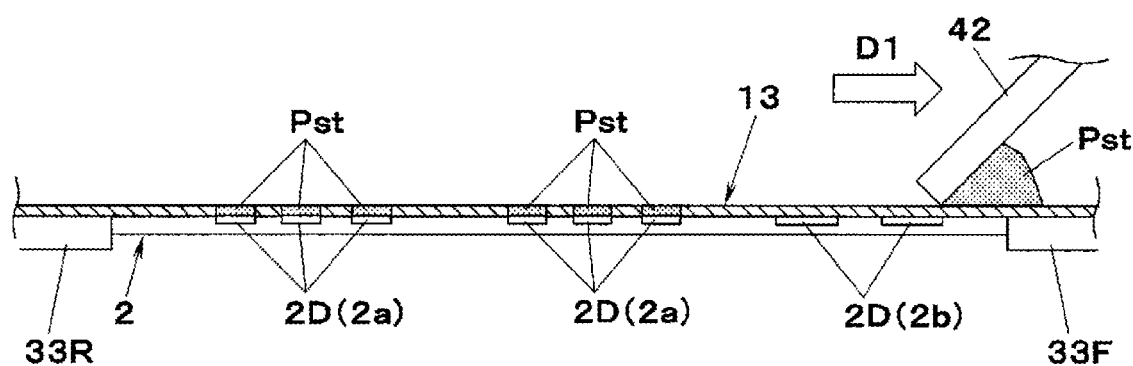
FIGS. 14A and 14B are views illustrating the mask and the substrate which are provided in the screen printing apparatus according to the first embodiment of the present invention.
Figure 14B:
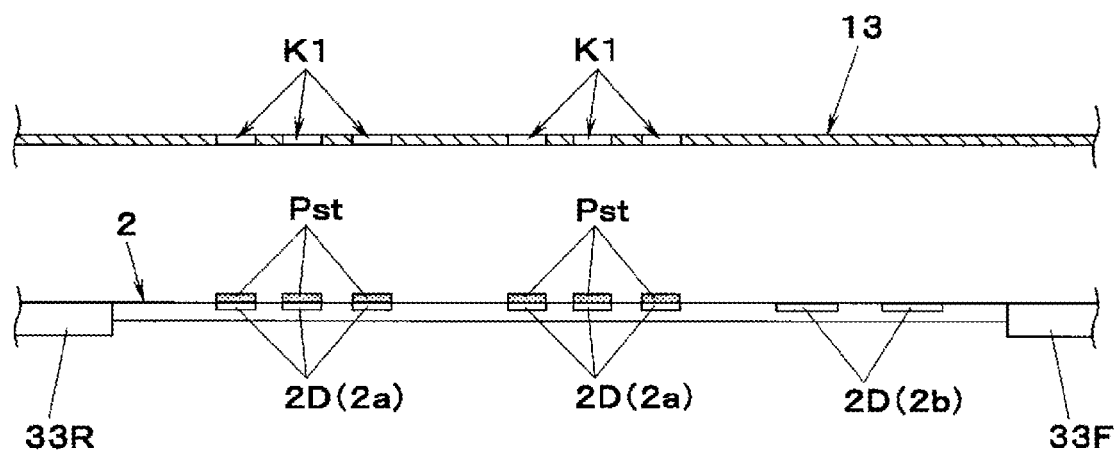
Figure 15A:
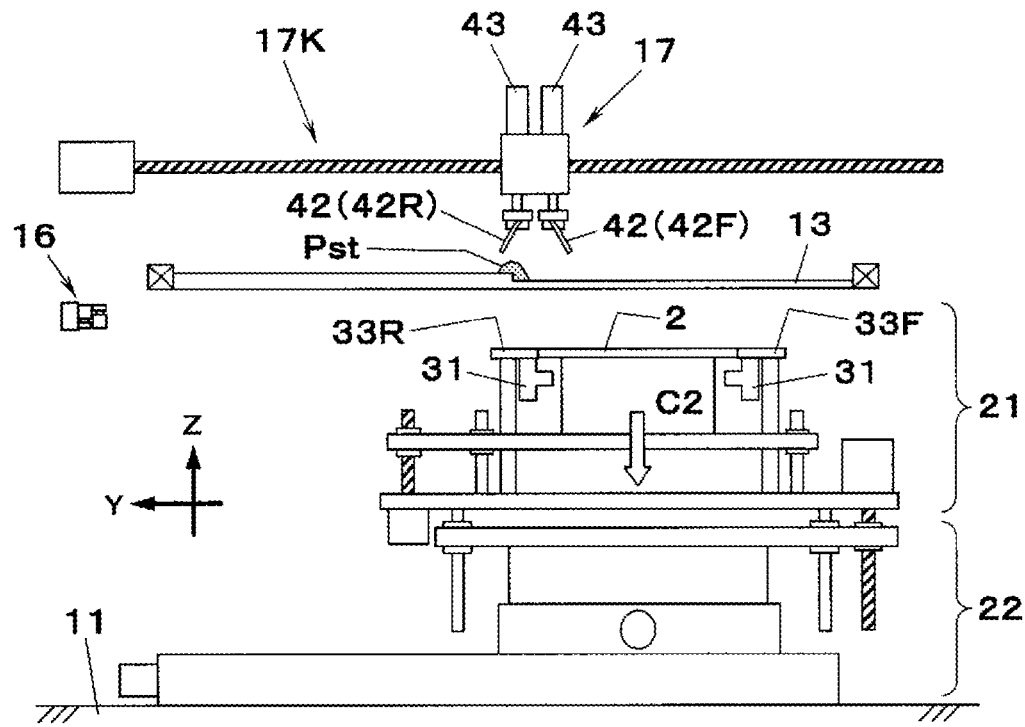
FIGS. 15A and 15B are views illustrating an operation of the screen printing apparatus according to the first embodiment of the present invention.

When the substrate 2 comes into contact with the front masking region R1, the printing head 17 lowers the rear squeegee 42R, and a lower end thereof abuts against the intermediate region Rm of the mask 13. In addition, by moving the rear squeegee 42R from the intermediate region Rm to the region on the front side of the front masking region R1, the rear squeegee 42R is slidably moved on the front masking region R1 (illustrated with an arrow D1 in FIGS. 13A and 14A). When the rear squeegee 42R moves up to the front region of the front masking region R1, after the printing head 17 raises the rear squeegee 42R, now, the front squeegee 42F is lowered, and a lower end thereof abuts against the mask 13. In addition, by moving the front squeegee 42F from the region on the front side of the front masking region R1 to the intermediate region Rm, the front squeegee 42F is slidably moved on the front masking region R1 (illustrated with an arrow D2 in FIG. 13B). When the inside of each first type opening K1 is filled with the paste Pst as the squeegee 42 slidably moves (FIG. 14A), the substrate holding and moving mechanism 12 lowers the substrate holding portion 21 (illustrated with an arrow C2 in FIG. 15A), and snapping-off is performed. Accordingly, a layer of the paste Pst having a thickness which corresponds to the thickness T1 of the mask 13 of the front masking region R1 is formed on each first type electrode 2a of the substrate 2 (FIG. 14B), and the primary printing is finished.

Figure 15B:
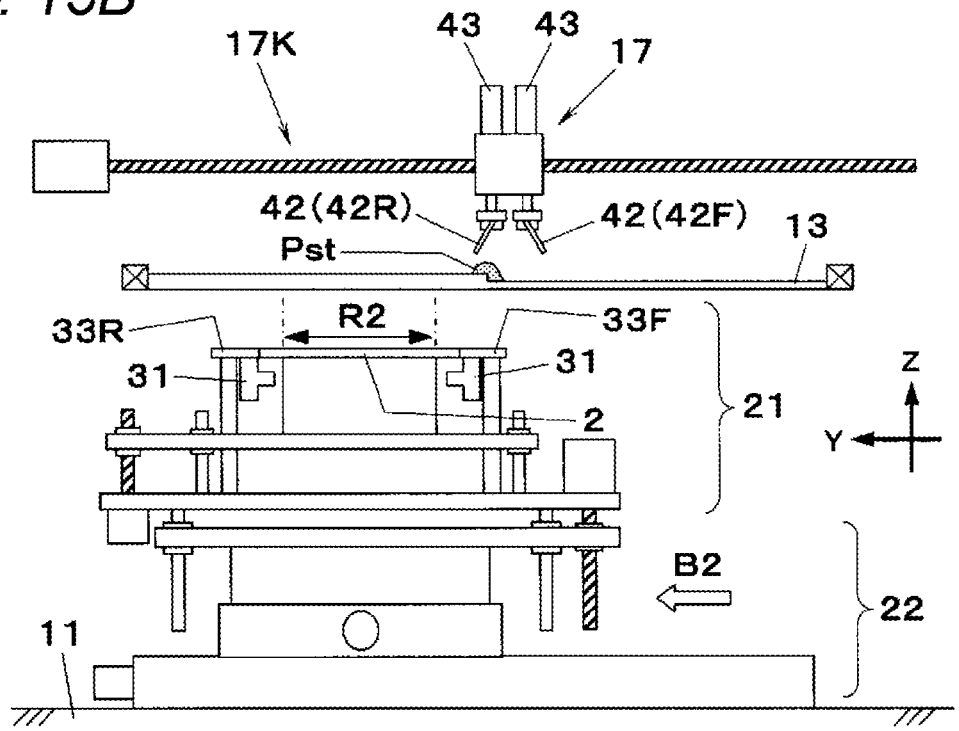
Figure 16A:
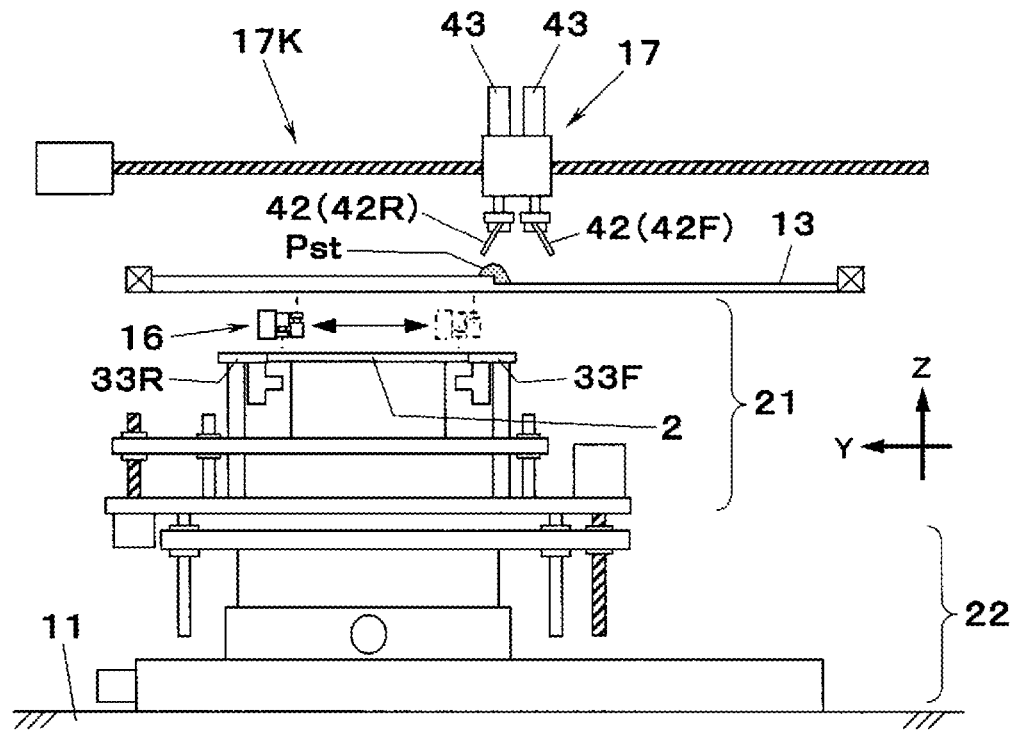
FIGS. 16A and 16B are views illustrating an operation of the screen printing apparatus according to the first embodiment of the present invention.
Figure 16B:
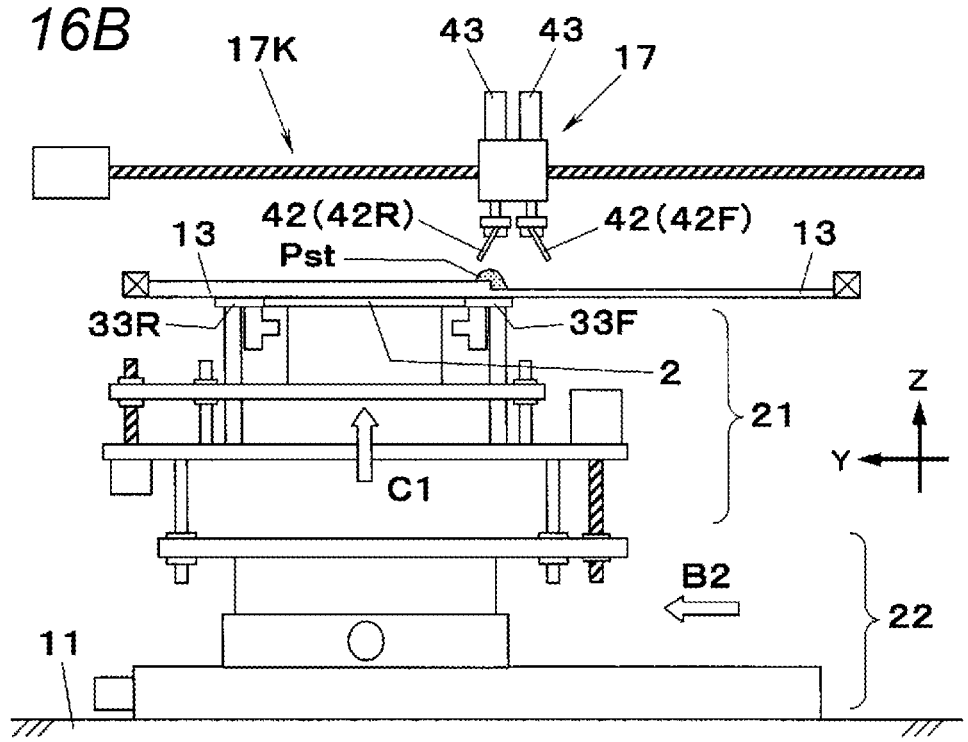
Figure 17A:
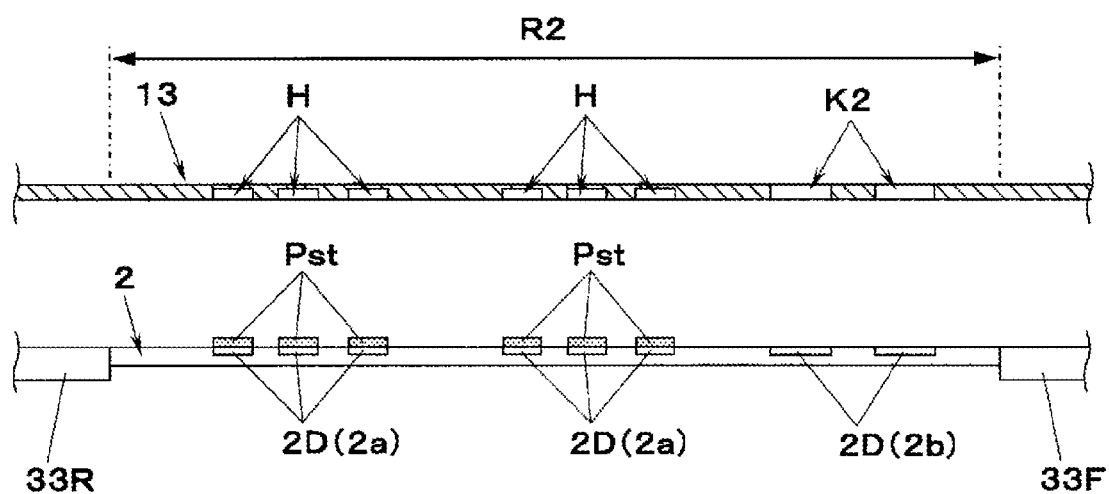
FIGS. 17A and 17B are views illustrating the mask and the substrate which are provided in the screen printing apparatus according to the first embodiment of the present invention.
Figure 17B:
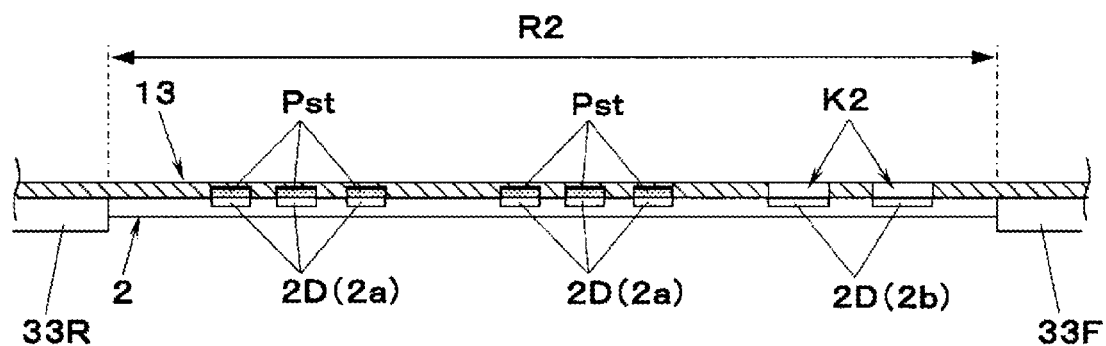

When the primary printing is finished, the substrate holding and moving mechanism 12 moves the substrate holding portion 21, and positions the substrate 2 below the rear masking region R2 (illustrated with an arrow B2 in FIG. 15B). When the substrate 2 is positioned below the rear masking region R2, the camera 16 moves, images the mask-side mark 13m in the rear masking region R2 by the lower imaging portion 16a, and images the substrate-side mark 2m by the lower imaging portion 16b (FIG. 16A). When the imaging by the camera 16 is finished, the substrate holding and moving mechanism 12 moves and raises the substrate 2 so that the obtained mask-side mark 13m and the substrate-side mark 2m match each other when viewed in a plan view, and brings the substrate 2 into contact with the rear masking region R2 (illustrated with an arrow C1 in FIG. 16B). Accordingly, each second type electrode 2b matches the corresponding second type opening K2, and is exposed on the upper surface side of the mask 13. Meanwhile, the paste Pst printed on the first type electrode 2a is stored inside a hollow H for avoiding interference which is provided in the rear masking region R2 (FIG. 17A to FIG. 17B). In addition, after finishing the primary printing, the front squeegee 42F is maintained in a state where the lower end thereof abuts against the intermediate region Rm and is stopped.

The above-described hollow H is provided in a pattern (that is, in the first pattern) which corresponds to the disposition of the first type electrode 2a in the rear masking region R2, and when the substrate 2 comes into contact with the rear masking region R2, the hollow H completely stores the pastes Pst which is printed on the upper surface of the first type electrode 2a. For this reason, during the secondary printing, the paste Pst printed on the first type electrode 2a in the primary printing is prevented from coming into contact with the lower surface of the mask 13.

Figure 18A:
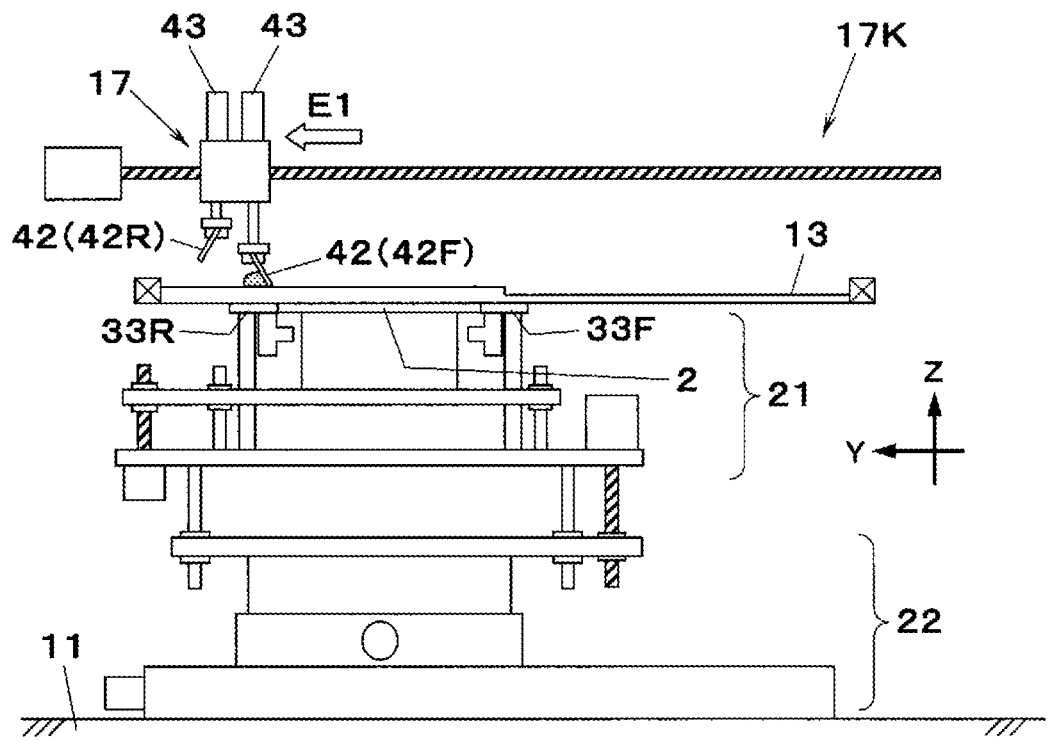
FIGS. 18A and 18B are views illustrating an operation of the screen printing apparatus according to the first embodiment of the present invention.
Figure 18B:
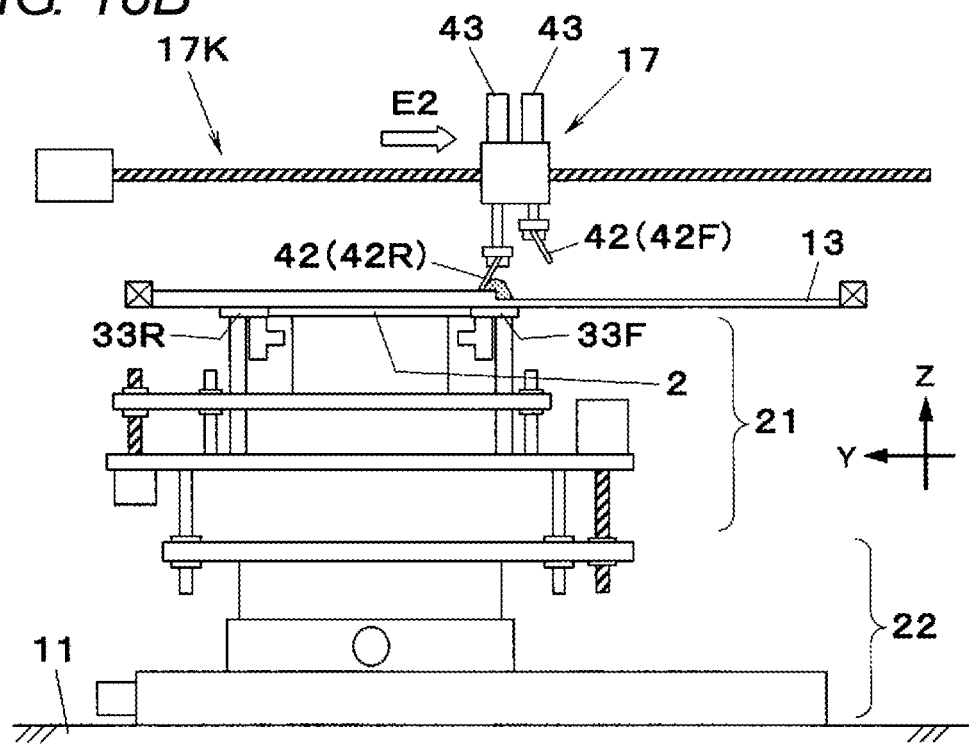
Figure 19A:
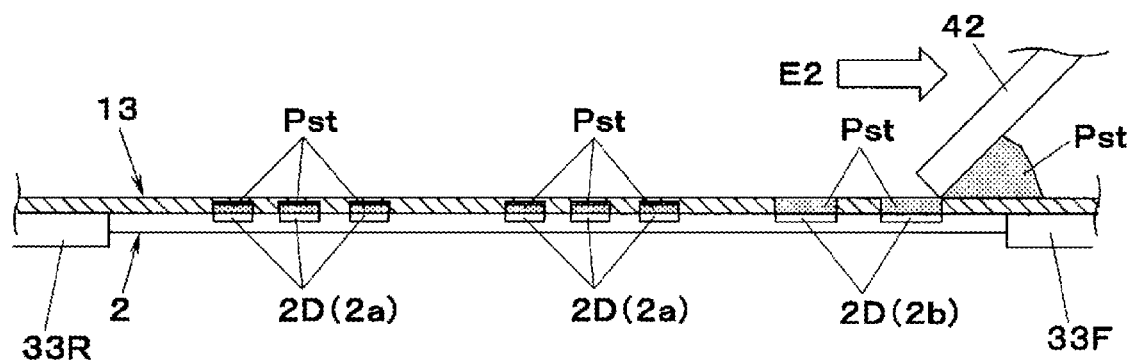
FIGS. 19A and 19B are views illustrating the mask and the substrate which are provided in the screen printing apparatus according to the first embodiment of the present invention.
Figure 19B:
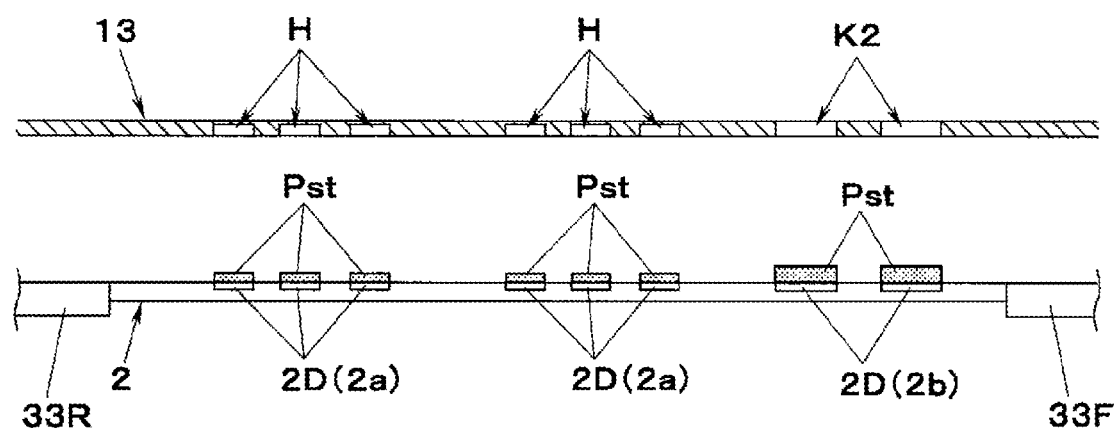

When the substrate 2 comes into contact with the rear masking region R2 of the mask 13, the printing head 17 moves the front squeegee 42F on the rear masking region R2 by moving the front squeegee 42F from the intermediate region Rm to the region on the rear side of the rear masking region R2 (illustrated with an arrow E1 in FIG. 18A). When the front squeegee 42F is moved up to the rear region of the rear masking region R2, after the printing head 17 raises the front squeegee 42F, now, the rear squeegee 42R is lowered, and the lower end thereof abuts against the mask 13. In addition, by moving the rear squeegee 42R from the region on the rear side of the rear masking region R2 to the intermediate region Rm, the rear squeegee 42R is slidably moved on the rear masking region R2 (illustrated with an arrow E2 in FIGS. 18B and 19A). When the inside of each second type opening K2 is filled with the paste Pst as the squeegee 42 slidably moves (FIG. 19A), the substrate holding and moving mechanism 12 lowers the substrate holding portion 21, and the snapping-off is performed. Accordingly, a layer of the paste Pst having a thickness which corresponds to the thickness T2 of the mask 13 of the rear masking region R2 is formed on each second type electrode 2b of the substrate 2 (FIG. 19B), and the secondary printing is finished.

In this manner, after the squeegee 42 slidably moves in the front masking region R1 of the mask 13, and the first type opening K1 is filled with the paste Pst, the squeegee 42 stops in the intermediate region Rm between the front masking region R1 and the rear masking region R2. After this, by starting the movement from the intermediate region Rm and slidably moving the rear masking region R2, the second type opening K2 is filled with the paste Pst. In other words, the squeegee 42 (specifically, the front squeegee 42F) is not separated from the mask 13 between a sliding operation on the front masking region R1 and a sliding operation on the rear masking region R2. For this reason, it is possible to smoothly and efficiently print two types of pastes Pst (two types of thicknesses) having different thicknesses from each other.

In the above-described manner, when the paste Pst is printed on each electrode 2D (the first type electrode 2a and the second type electrode 2b) on the substrate 2, and the screen printing per one substrate 2 is finished, the substrate holding and moving mechanism 12 opens the pair of the clampers 33 and releases the held state of the substrate 2. In addition, the positioning conveyor 31 is operated, the substrate 2 is delivered on the carrying-out conveyor 15, and the carrying-out conveyor 15 carries out the received substrate 2 to the component mounting apparatus 5 on the upstream process side.

In FIG. 1, the component mounting apparatus 5 is provided with a substrate carrying conveyor 71 for carrying and positioning the substrate 2, a parts feeder 72 which supplies the component 3, and a mounting mechanism 74 which picks up the component 3 supplied by the parts feeder 72 by a mounting head 73, and mounts the component 3 onto the substrate 2 positioned by the substrate carrying conveyor 71. The component mounting apparatus 5 mounts the small-sized component, such as a chip component, on the first type electrode 2a, and mounts the large-sized component, such as the connector, on the second type electrode 2b. When mounting work of the component 3 with respect to the substrate 2 is finished, the component mounting apparatus 5 operates the substrate carrying conveyor 71, and carries out the substrate 2 to the downstream process side. In this manner, the mounted substrate 2J is manufactured by the component mounting line 1.

Second Embodiment

Figure 20:
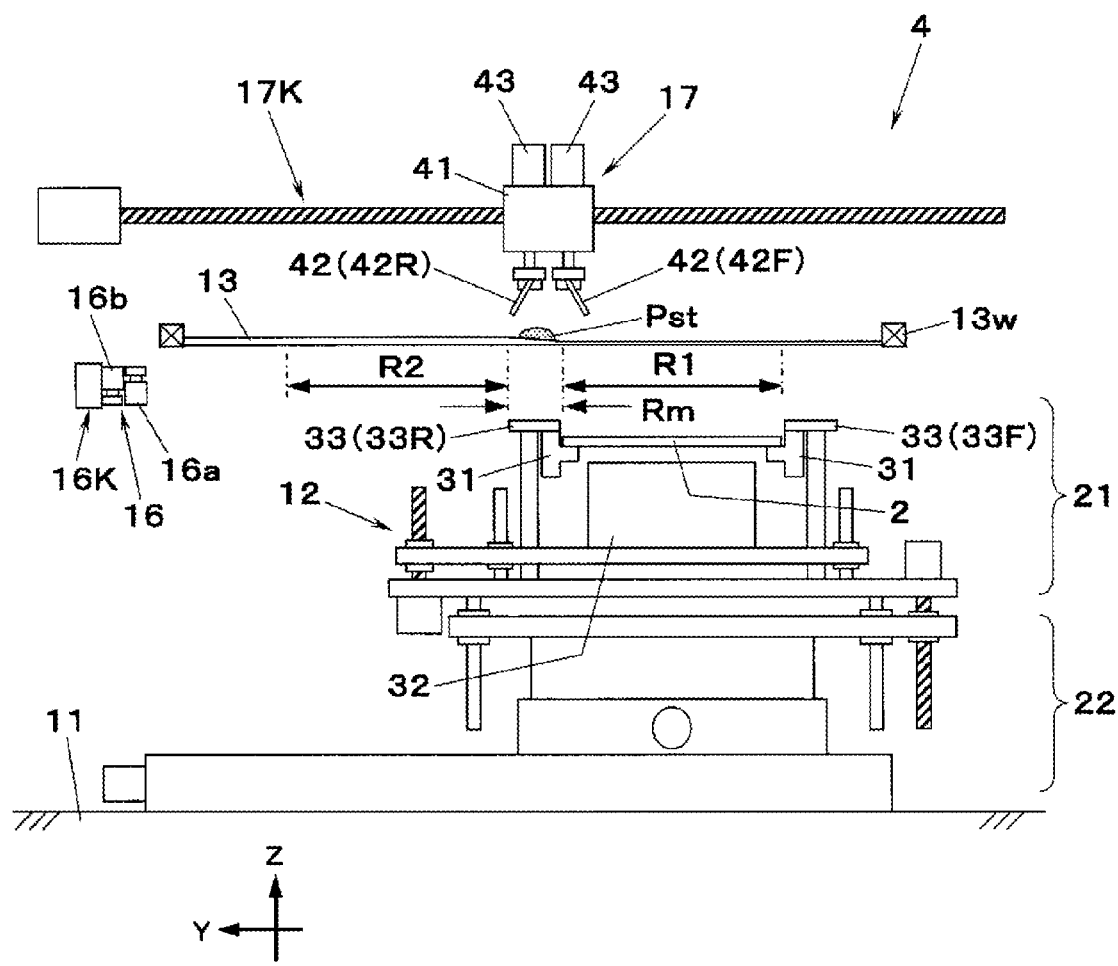
FIG. 20 is a side view of a screen printing apparatus according to a second embodiment of the present invention.
Figure 21:
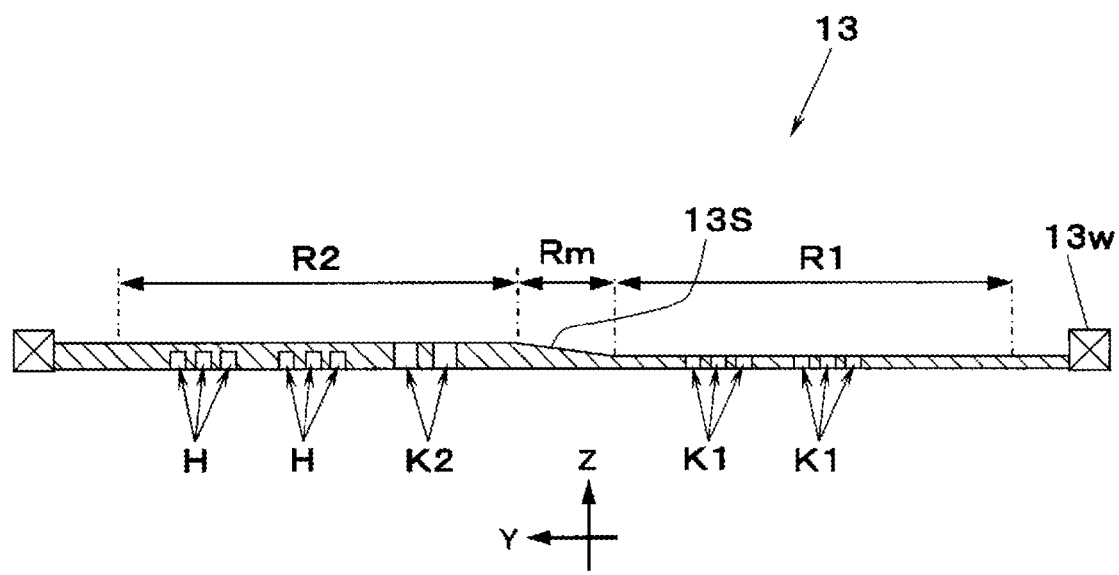
FIG. 21 is a side view of a mask which is provided in the screen printing apparatus according to the second embodiment of the present invention.

FIG. 20 illustrates the screen printing apparatus 4 according to a second embodiment of the present invention. The screen printing apparatus 4 according to the second embodiment has substantially the same operation during the screen printing as that of the screen printing apparatus 4 according to the first embodiment, but the configurations of the mask 13 are different from each other. In other words, the mask 13 of the screen printing apparatus 4 according to the second embodiment is provided with an inclination surface 13S in which the upper surface of the intermediate region Rm in the mask 13 according to the first embodiment connects the upper surface of the front masking region R1 and the upper surface of the rear masking region R2 to each other (refer to FIG. 21). Accordingly, since the upper surface of the front masking region R1 and the upper surface of the rear masking region R2 are smoothly linked to each other, and the movement of the paste Pst on the mask 13 becomes smooth, a scraping operation of the paste Pst becomes smooth.

Third Embodiment

Figure 22:
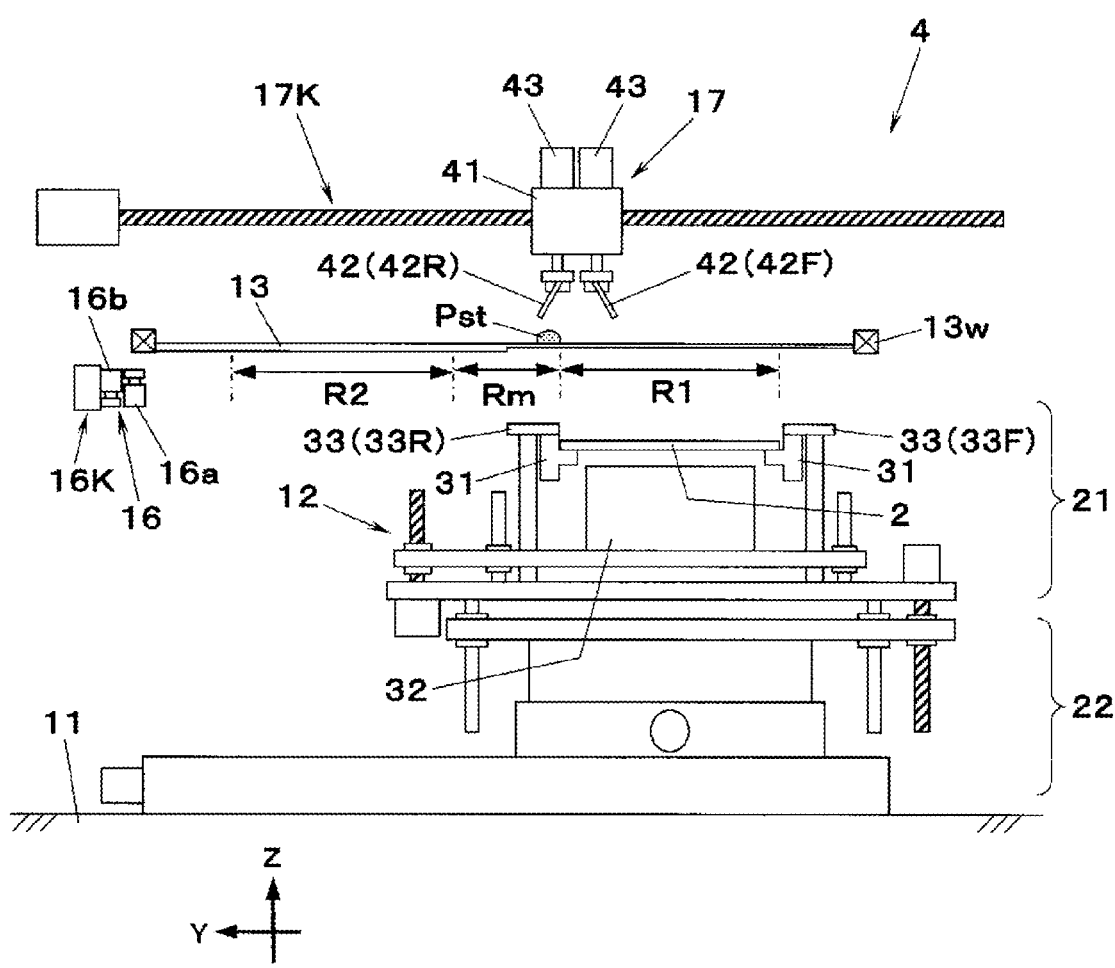
FIG. 22 is a side view of a screen printing apparatus according to a third embodiment of the present invention.

FIG. 22 illustrates the screen printing apparatus 4 according to a third embodiment of the present invention. The screen printing apparatus 4 according to the third embodiment, also has substantially the same operation during the screen printing as that of the screen printing apparatus 4 according to the first embodiment, but the configurations of the mask 13 are different from each other. In other words, in the screen printing apparatus 4 according to the third embodiment, the upper surface of the front masking region R1 and the upper surface of the rear masking region R2 are the same plane, and the height of the upper surface of the front masking region R1 and the height of the upper surface of the rear masking region R2 are equivalent to each other (refer to FIG. 23). For this reason, similar to a case of the second embodiment, the movement of the paste Pst on the mask 13 becomes smooth, and a scraping operation of the paste Pst becomes smooth.

Figure 23:
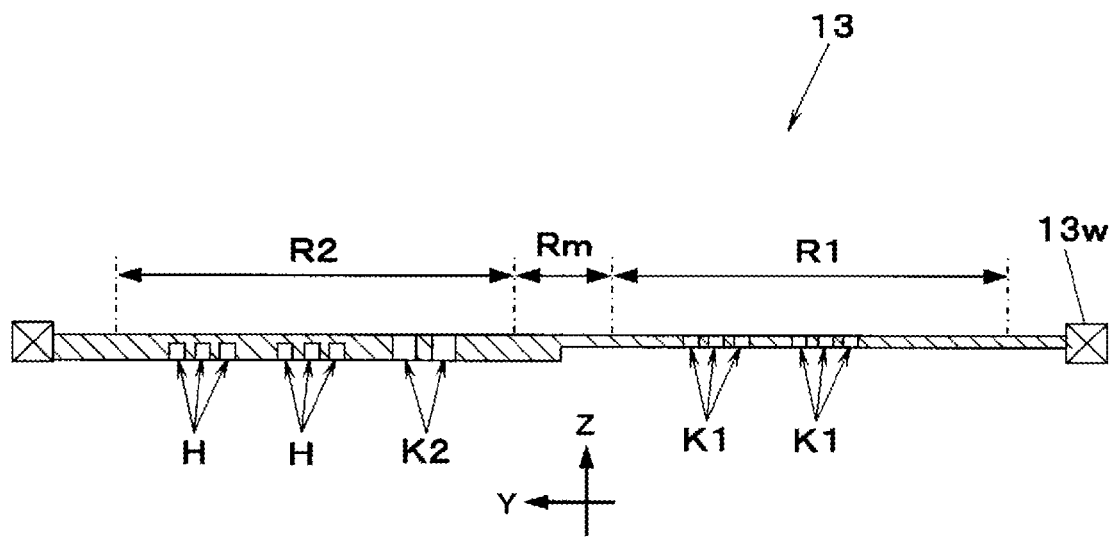
FIG. 23 is a side view of a mask which is provided in the screen printing apparatus according to the third embodiment of the present invention.
Figure 24A:
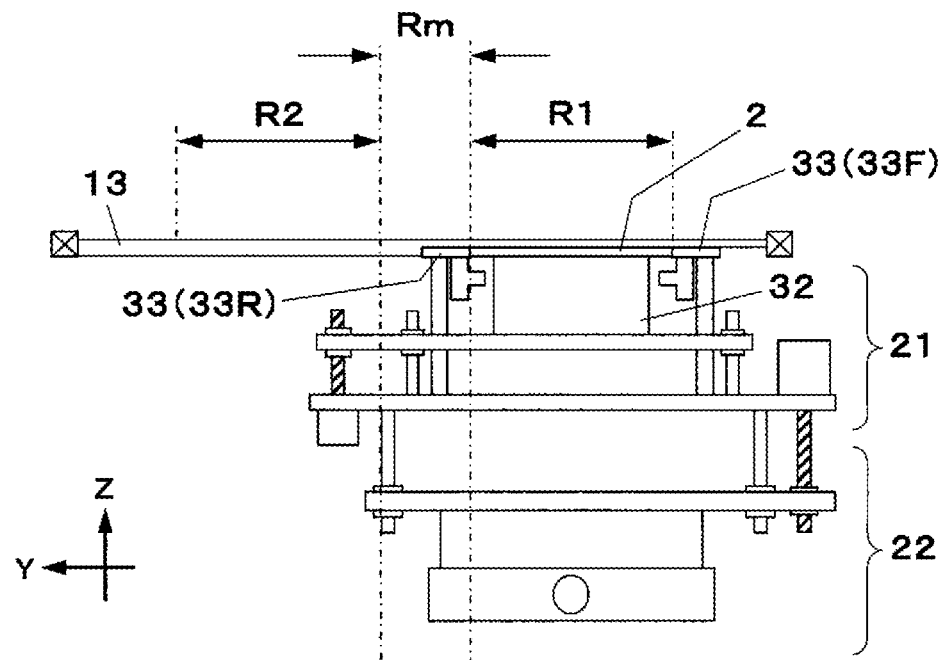
FIGS. 24A and 24B are partial side views of the screen printing apparatus according to the third embodiment of the present invention.
Figure 24B:
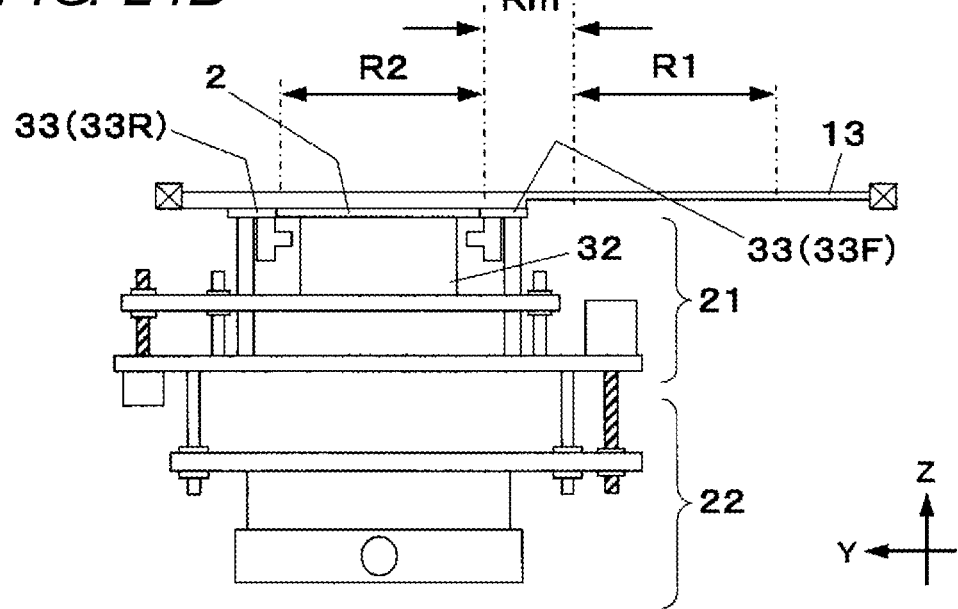

As can be ascertained from FIGS. 22 and 23, in the third embodiment, the height of the lower surface of the rear masking region R2 is lower than the height of the lower surface of the front masking region R1, and the step between both regions is formed on the lower surface side of the mask 13. For this reason, when the substrate 2 is brought into contact with the front masking region R1, the rear clamper 33R comes into contact with the inside of the front masking region R1 (FIG. 24A). In addition, when the substrate 2 is brought into contact with the rear masking region R2, the front clamper 33F comes into contact with the inside of the rear masking region R2 (FIG. 24B). In the first embodiment and the second embodiment, the height when the substrate 2 comes into contact with the front masking region R1 is the same as the height when the substrate 2 comes into contact with the rear masking region R2, but in the third embodiment, the height when the substrate 2 comes into contact with the front masking region R1 is different from the height when the substrate 2 comes into contact with the rear masking region R2 only by the amount of the step.

As described above, the screen printing apparatus 4 according to the above-described first to the third embodiments, includes the mask 13 which has the first type opening K1 (first opening) in the front masking region R1 (first region), and the second type opening K2 (second opening) in the rear masking region R2 (second region). In addition, the first type opening K1 is filled with the paste Pst in a state where the substrate 2 is brought into contact with the front masking region R1, and then, the second type opening K2 is filled with the paste Pst in a state where the substrate 2 is brought into contact with the rear masking region R2. According to this, it is possible to print two types of pastes Pst which have different thicknesses from each other on the substrate 2. In other words, one mask 13 performs a function which corresponds to that of two masks, and only one prepared mask 13 may be employed. For this reason, according to the screen printing apparatus 4 according to the first to the third embodiments, it is possible to print two types of pastes Pst which have different thicknesses from each other without increasing the size of the apparatus.

In addition, in the above-described first to the third embodiments, the printing head 17 is provided with the squeegee 42 which slidably moves on the mask 13, and fills the first type opening K1 and the second type opening K2 with the paste Pst, but the printing head 17 may not be necessarily provided with the squeegee 42. For example, a printing head which moves on the mask 13 and fills the first type opening K1 and the second type opening K2 with the paste Pst while ejecting the paste Pst sealed in a cartridge may be employed. In this case, if the printing head fills the first type opening K1 with the paste Pst, and then fills the second type opening K2 with the paste Pst, the moving direction of the printing head 17 may be arbitrary. Furthermore, in the above-described first to the third embodiments, two regions (the first region and the second region) which have different thicknesses from each other are provided to be aligned in the longitudinal direction of the mask 13, but this is merely an example, and may be provided to be aligned in a direction other than the longitudinal direction of the mask 13.

There are provided a screen printing apparatus which can print two types of pastes which have different thicknesses from each other without increasing the size of the entire apparatus, and a component mounting line.

What is claimed is:

1. A method of screen printing by using a mask which has a first opening provided in a first region, a second opening provided in a second region which is thicker than the first region, and an intermediate region provided between the first region and the second region, said method comprising
   supplying a paste to the intermediate region;
   bringing a substrate into contact with the first region of the mask;
   moving a printing head from the intermediate region to an end portion on the first region, and then moving the printing head from the end portion on the first region to the intermediate region, to fill a portion of the paste into the first opening and to keep a remaining portion of the paste on the intermediate region;
   separating the substrate from the first region of the mask to form a layer of the paste corresponding to the first region on the substrate;
   bringing the substrate into contact with the second region of the mask;
   moving the printing head from the intermediate region to an end portion on the second region, and then moving the printing head from the end portion on the second region to the intermediate region, to fill at least a part of the remaining portion of the paste into the second opening;
   separating the substrate from the second region of the mask to form a layer of the paste corresponding to the second region on the substrate.

2. The method of screen printing according to claim 1, wherein the printing head includes a first squeegee and a second squeegee, and
   wherein the first squeegee is moved from the intermediate region to the end portion on the first region, and then the second squeegee is moved from the end portion on the first region to the intermediate region, to fill the portion of the paste into the first opening and to keep the remaining portion of the paste on the intermediate region, and
   wherein the second squeegee is moved from the intermediate region to the end portion on the second region, and then the first squeegee is moved from the end portion on the second region to the intermediate region, to fill the at least a part of the remaining portion of the paste into the second opening.

* * * * *